United States Patent [19]

Hayase et al.

[11] Patent Number: 5,580,702
[45] Date of Patent: Dec. 3, 1996

[54] METHOD FOR FORMING RESIST PATTERNS

[75] Inventors: Rumiko Hayase, Kawasaki; Yasunobu Onishi; Hirokazu Niki, both of Yokohama; Noahiko Oyasato, Kawaguchi; Yoshihito Kobayashi; Shuzi Nayase, both of Kawasaki, all of Japan

[73] Assignee: Kabushiki Kaisha Toshiba, Kawasaki, Japan

[21] Appl. No.: 357,179

[22] Filed: Dec. 13, 1994

Related U.S. Application Data

[62] Division of Ser. No. 876,457, Apr. 30, 1992, Pat. No. 5,403,695.

[30] Foreign Application Priority Data

Apr. 30, 1991 [JP] Japan ............................ 3-128737
Sep. 30, 1991 [JP] Japan ............................ 3-276188

[51] Int. Cl.$^6$ .................... G03F 7/30; G03F 7/023; G03F 7/039
[52] U.S. Cl. .................... 430/326; 430/165; 430/166; 430/176; 430/191; 430/192; 430/193; 430/270.1; 430/273.1; 430/330

[58] Field of Search .................... 430/191, 192, 430/193, 270.1, 165, 176, 326, 166, 330, 273.1

[56] References Cited

U.S. PATENT DOCUMENTS

| | | | |
|---|---|---|---|
| 4,491,628 | 1/1985 | Ito et al. | 430/270.1 |
| 4,837,124 | 6/1989 | Wu et al. | 430/270.1 |
| 5,118,582 | 6/1992 | Ueno et al. | 430/270.1 |
| 5,403,695 | 4/1995 | Hayase et al. | 430/192 |

FOREIGN PATENT DOCUMENTS

2-161436  6/1990  Japan .................... 430/909

*Primary Examiner*—John S. Y. Chu
*Attorney, Agent, or Firm*—Oblon, Spivak, McClelland, Maier & Neustadt, P.C.

[57] ABSTRACT

Disclosed herein is a resist for forming patterns, which is greatly sensitive to ultraviolet rays an ionizing radiation, and which can therefore form a high-resolution resist pattern if exposed to ultra violet rays or an unionizing radiation. Hence, the resist is useful in a method of manufacturing semicon ductor devices having high integration densities. The resist comprises tert-butoxycarbonyl methoxypolyhydroxy styrene and an o-quinonediazide compound.

18 Claims, 1 Drawing Sheet

METHOD FOR FORMING RESIST PATTERNS

This is a division of application Ser. No. 07/876,457 filed on Apr. 30, 1992, U.S. Pat. No. 5,403,695.

BACKGROUND OF THE INVENTION

1. Field of the Invention

The present invention relates to a resist suitable for forming patterns during the manufacture of semiconductor devices, particularly the manufacture of largescale integrated (LSI) circuits.

2. Description of the Related Art

Photolithography is used in some steps of manufacturing a semiconductor device such as an LSI circuit. This technology is to etch substrate (e.g., a silicon single-crystal wafer), thereby to form fine lines and small widows. More specifically, a photoresist film is formed on the substrate by means of spin coating, and is then exposed to light applied through a pattern mask. The film is developed and rinsed, and is thereby made into a resist pattern. Then, the substrate is etched by using the resist pattern, thereby forming fine lines and small widows in the surface of the substrate.

It is increasingly desired that LSI circuits have higher integration densities. Here arises a demand for technology which can form lines and windows in a substrate, which are finer and smaller than those made by the existing photolithography. To meet this demand, use is made of a light source which can apply a light beam having as short a wavelength as is possible to a photoresist film. More precisely, a deep UV source, such as an KrF excimer laser or an ArF excimer layer, is employed in photolithography.

The conventional resist absorbs light having a short wavelength, so much that the sufficient light fails to reach that surface of the resist film which faces away from the light-receiving surface. After the resist film is developed and rinsed, it will have openings inevitably having a cross section shaped like an inverted triangle. Consequently, when the substrate on which the resist film is formed is etched, using the resist film as etching mask, an original LSI is not transferred to the substrate, with sufficient accuracy.

To solve the problem with the conventional resist, it has been proposed that so-called chemically amplified resist be utilized. A chemically amplified resist contains a compound which generates strong acid when exposed to light (hereinafter referred to, when necessary, as "acid generator"), and also a compound in which hydrophobic groups are decomposed by acid and which is thereby changed into a hydrophilic substance. Various resists of this type are known. To be more specific, U.S. Pat. No. 4,491,628 (1985) to H. Ito, C. G. Wilson, and J. M. J. Fréchet discloses a positive resist containing a polymer wherein the hydroxyl group of poly(p-hydroxystyrene) is blocked by butoxycarbonyl group, and onium salt which generates an acid when exposed to light. Also, M. J. O'Brien, J. V. Crivello, SPIE, Vol. 920, Advances in Resist Technology and Processing, p. 42, (1988) discloses a positive resist containing m-creosol novolac resin, naphthalene-2-carboxylic acid-tert-butylester, and triphenylsulfonium salt. Further, H. Ito, SPIE, Vol. 920, Advances in Resist Technology and Processing, p. 33, (1988) discloses a positive resist containing onium salt and 2,2-bis(4-tert-butoxycarbdnyloxyphenyl) propane or polyphthalaldehyde.

The acid generator acts as a catalyst, efficiently reacting with other substances. Hence, when light is applied to the resist film, chemical reaction thoroughly takes place even in that surface of the film which faces away from the light-receiving surface and to which the light can hardly reach. As a result, the resist film can be made, after developed and rinsed, into a resist pattern having openings which has steep sides.

Each of the resists specified above contains onium salt used as acid generator. Onium salt includes arsenic or antimony which are harmful to human. In view of this, it would be questionable to put onium salt to industrial use. In case arsenic or antimony remains on the substrate (e.g., a wafer) after the resist pattern has been removed, it will probably impair the characteristics of the electronic circuit to be formed on the substrate. Resist containing onium salt has another disadvantage. In the surface of a film of this resist, there will probably be formed a layer which is hard to dissolve, inevitably making scars in the upper surface of the resultant resist pattern. Such scars are detrimental to the subsequent etching of the substrate.

SUMMARY OF THE INVENTION

The object of the present invention is to provide a resist which is highly sensitive to ultraviolet rays and ionizing radiation and has a high resolution, and which is therefore suitable for forming patterns during the manufacture of semiconductor devices.

In a first aspect of the invention, there is provided a resist for forming patterns, which comprises:

(a) an acid-generating compound which generates an acid when exposed to a chemical radiation; and (b) a compound which has an acid decomposable substituent group and which is represented by the following formula (I):

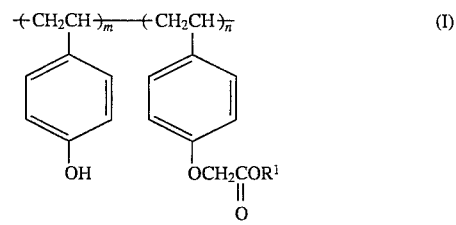

where $R^1$ is a monovalent organic group, m is 0, 1, or a positive number greater than 1, and n is a positive number.

In a second aspect of the invention, there is provided a resist for forming patterns, which comprises:

(a) a compound having an acid decomposable substituent group;

(b) an acid-generating compound which generates an acid when exposed to a chemical radiation; and (c) carboxylic acid.

In a third aspect of the invention, there is provided a resist for forming patterns, which comprises:

(a) a compound having an acid decomposable substituent group;

(b1) a first acid-generating compound which generates a strong acid when exposed to a chemical radiation; and (b2) a second acid-generating compound which generates a acid weaker than the strong acid, when exposed to a chemical radiation.

In a fourth aspect of the invention, there is provided a resist for forming patterns, which comprises:

(a) a compound having an acid decomposable substituent group; and (b) o-quinonediazide compound.

The term "chemical radiation," used above, is a general name for energy radiation and matter radiation which chemically change a resist and encompasses X rays, ultraviolet rays having short wavelengths, and ionizing radiation such as electron beams.

Resists (1) to (4) for forming patterns, all according to the invention, will be described in detail.

The resist (1) comprises an acid-generating compound, and a compound which has an acid decomposable substituent group and which is represented by the following formula (I):

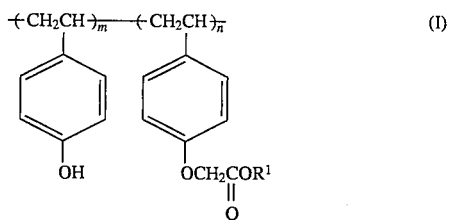

where $R^1$ is a monovalent organic group, m is 0, 1, or a positive number greater than 1, and n is a positive number.

$R^1$ can be any monovalent organic group. Nonetheless, its preferable examples are: methyl, ethyl, n-propyl, iso-propyl, n-butyl, tert-butyl, iso-butyl, sec-butyl, and benzyl. Of these groups, tert-butyl is the most preferable.

The value for n/(m+n) in the formula (I) ranges from 0.03 to 1, preferably 0.05 to 0.70. If n/(m+n) is less than 0.03, the difference in etching speed between a portion exposed to a chemical radiation and a portion not exposed thereto will be too small.

The compound represented by the formula (I), which will hereinafter be referred to as "acid decomposable compound", is preferably one which has a molecular weight of 1000 or more. If the acid decomposable compound has a molecular weight less than 1000, the resist will be less heat-resistant than desired.

The acid generator, which generates acid when exposed to a chemical radiation, can be various known compounds or various known mixtures. Examples of the acid generator are: salts such as diazonium salt, phosphonium salt, sulfonium salt and iodonium salt (e.g., diphenyliodonium trifluoromethane sulfonate), organic halogen compounds, orthoquinone-diazidesulfonylchloride, and ester sulfonate. The organic halogen compounds are compounds which form hydrogen halogenide acid. These compounds are disclosed in U.S. Pat. Nos. 3,515,552, 3,536,489, and 3,779,778, and West German Offenlegungschrift 22 43 621. Other compounds which generate acid when exposed to a chemical radiation are disclosed in Published Unexamined Japanese Patent Applications 54-74728, 55-24113, 55-77742, 60-3626, 60-138539, 56-17345, and 50-36209.

Specific examples of the compounds described above are: di(p-tert-butylphenyl) iodonium trifluoromethanesulfonate, diphenyliodonium trifluoromethanesulfonate, benzoine tosylate, o-nitrobenzyl p-toluenesul fonate, triphenylsulfonium trifluoromethanesulfonate, tri(tert-butylphenyl) sulfonium trifluoromethanesul fonate, benzendiazonium p-toluenesulfonate, 4-(di n-propylamino)-benzonium tetrafluorobrate, 4-p-tolyl-mercapto-2,5-diethoxy-benzendiazonium hexafluorophos phate, tetrafluoroborate, diphenylamine-4-diazonium sulfate, 4-methyl-6-trichloromethyl-2-pyrone, 4-(3,4,5-trimethoxy-styryl)-6-trichloromethyl-pyrone, 4-(4-methoxy-styryl)-6-(3,3,3-trichloro-propenyl)-2-pyrone, 2-trichloromethyl-benzimidazole, 2-tribromomethyl-quinoline, 2,4-dimetyl-1-tribromoacetyl benzene, 4-dibromoacetyl-benzoic acid, 1,4-bis-dibromomethyl-benzene, tris-dibromomethyl-S-triazine, 2-(6-methoxy-naphtyl-2-yl)-4,5-bis-trichloromethyl-S-triazine, 2-(naphtyl-1-yl)-4,6-bis-trichloromethyl-S-triazine, 2-(naphtyl-2-yl)-4,6-bis-trichloromethyl-S-triazine, 2-(4-ethoxyethyl-naphtyl-1-yl)-4,6-bis-trichloromethyl-S-triazine, 2-(benzopyranyl-3-yl)-4,6-bis-trichloro-methyl-S-triazine, 2-(4-methoxy-anthoracyl-1-yl)-4,6-bis-trichloromethyl-S-triazine, 2-(phenantyl-9-yl)-4,6-bis-trichloromethyl-S-triazine, o-naphthoquinonediazide-4-sulfonic chloride, and the like.

Specific examples of ester sulfonate: naphtho-quinoneazide-4-ester sulfonate, naphthoquinonediazide-5-ester sulfonate, p-toluenesulfonic acid-o-nitrobenzyl ester, p-toluenesulfonic acid-2,6-dinitrobenzyl ester, and the like.

It is desirable that the acid generator be o-quinonediazide compound. A preferable example of o-quinonediazide compound is ester made from o-quinonediazide sulfonic acid and phenol compound, which can be prepared by reacting o-quinonediazide sulfonic chlroide with phenol compound by the ordinary method. The o-quinonediazide sulfonic chloride can be 1-benzophenone-2-diazo-4-sulfonic chloride, 1-naphthoquinone-2-diazo-5-sulfonic chloide, 1-naphthoquinone-2-diazo-4-sulfonic chloride, or the like. Examples of the phehol compound are: phenol, cresol, xylenol, bisphenol A, bisphenol S, hydroxybenzophenone, 3,3,3',3'-tetramethyl-1,1'-spiroindan-5,6,7,5',6',7'-hexanol, phenolphthalein, p-hydroxybenzylidene maleic dimethyl, p-hydroxybenzylidene maleic diethyl, cyanophenol, nitrophenol, nitrosophenole, hydroxyacetophenone, trihydroxy methyl benzoate, polyvinylphenol, novolac resin, and the like.

Such o-quinonediazide compounds as described above are shown in Tables 1 to 5 attached hereto.

Of these o-quinonediazide compounds, 1-naphthoquinone-2-diazo-4-ester sulfonate is the most desirable. This ester generates carboxylic acid and sulfonic acid stronger than carboxylic acid when exposed to a chemical radiation, as is described in J. J. Grunwald, C. Gal, S. Eidelman, SPIE, Vol. 1262, Advances in Resist Technology and Processing VII, p. 444, (1990). The ester performs a prominent catalytic action and is, therefore, useful.

The resist (1) according to the invention contains 0.1 to 30 wt %, more preferably 0.5 to 20 wt %, of the components of the resist (1). If the amount of the acid generator used is less than 0.1 wt %, the resist can hardly be sufficiently sensitive to light. If the amount of the acid generator is more than 30 wt %, the resist (1) may fail to form a homogeneous resist film, or residue may be formed after the resist film has been developed or etched.

The resist (1) can comprise carboxylic acid as a third component, in addition to the acid decomposable compound and the acid generator. The carboxylic acid increases the speed at which the resist (1) is dissolved in alkali aqueous solution, so that less scars than otherwise may be formed in the surface of the resist pattern to be formed of the resist (1). The carboxylic acid can be any one that can mix uniformly with the other components of the resist (1). Specific examples of the carboxylic acid are: formic acid, acetic acid, propionic acid, butyric acid, 2-methylpropanoic acid, valeric acid, isovaleric acid, α-methylbutyric acid, trimethylacetic acid, hexanoic acid, 4-methylpentanoic acid, 2-methylbutanoic acid, 2,2-dimethybutanoic acid, heptanoic acid, octanoic acid, nonanoic acid, decanoic acid, undecanoic acid, dodecanoic acid, tetradecanoic acid, hexadecanoic acid, heptadecanoic acid, octadecanoic acid, eicosanoic acid, docosanoic acid, hexacoanoic acid, triaconoic acid, oxalic acid, malonic acid, succinic acid, glutaric acid, adipic acid, pimelic acid, suberic acid, azelaic acid, sebacic acid, ascorbic acid, tridecanedioic acid, methylmaloic acid, dimethyl maloic acid, methylsuccinic acid, 2,2-dimethylsuccinic acid, 2,3-dimethylsuccinic acid, tetramethylsuccinic acid, 1,2,3-propanetricarboxylic acid, 1,2,3-propanetricarboxylic acid, 2,3-dimethylbutane-1,2,3-tricarboxylic acid, fluoroacetic acid, trifluoroacetic acid, chloroacetic acid, dichloroacetic acid, trichloroacetic acid, bromoacetic acid, iodoacetic acid, 2-chloropropionic acid, 3-chloropropionic acid, 2-bromopropionic acid, 3-bromopropionic acid, 2-iodopropionic acid, 2,3-dichloropropionic acid, chlorosuccinic acid, bromosuccinic acid, 2,3-dibromosuccinic acid, hydoxyacetic acid, lactic acid, 2-hydroxybutyric acid, 2-hydroxy-2-methylpropanoic acid, 2-hydroxy-4-methypentanoic acid, 3-hydroxy-3-pentanecarboxylic acid, 3-hydroxypropionic acid, 10-hydroxyoctanedecanoic acid, 3,3,3-trichloro-2-hydroxypropionic acid, 2-(lactoyloxy) propionic acid, glyceric acid, 8,9-dihydroxyoctadecanoic acid, tartronic acid, malic acid, acetoxysuccinic acid, 2-hydroxy-2-methylbutanedioic acid, 3-hydroxypentanedioic acid, tartaric acid, d-ethylhydrogentartrate, tetrahydroxysuccinic acid, citric acid, 1,2-dihydorxy-1,1,2-ethane-tricarboxylic acid, ethoxyacetic acid, 2,2'-oxydiacetic acid, 2,3-epoxypropionic acid, pyruvic acid, 2-oxysobutyric acid, acetoacetic acid, 4-oxovaleric acid, 9,10-dioxyoctadecanoic acid, mesoxalic acid, oxyaloacetic acid, 3-oxoglutaric acid, 4-oxoheptainedioic acid, benozic acid, toluic acid, ethylbenzoic acid, p-isopropylbenzoic acid, 2,3-dimethylbezonic acid, 2,4-dimethylbenzoic acid, 2,5-dimethylbenzoic acid, 3,5-dimethylbenzoic acid, 2,4,5-trimethylbenzoic acid, phthalic acid, isophthalic acid, terephthalic acid, 5-methylisophthalic acid, 1,2,3-benzenetricarboxylic acid, 1,2,4-benzenetricarboxylic acid, 1,3,5-benzenetricarboxylic acid, 1,2,3,4-benzenetetracarboxylic acid, 1,2,3,5-benzenetetracarboxylic acid, 1,2,4,5-benzenetetracarboxylic acid, benzenepentacarboxylic acid, benzenhexacaroxylic acid, fluorobenzoic acid, chlorobenzoic acid, dichlorobenzoic acid, trichlorobenzoic acid, bromobenzoic acid, dibromobenzoic acid, iodobenzoic acid, chlorophthalic acid, dichlorophthalic acid, tetrachlorophthalic acid, nitrosobenzoic acid, o-nitrobezonic acid, p-nitrobenzoic acid, 2,4-dinitrobenzoic acid, 2,4,6-nitrobenzoic acid, 3-nitrobenzoic acid, 5-nitroisophthalic acid, 2-nitroterephthalic acid, p-hydroxybenzoic acid, salicylic acid, 5-chlorosalicylic acid, 3,5-dichlorosalicylic acid, 3-nitrosalicylic acid, 3,5-dinitrosalicylic acid, 2,4-dihyroxybezonic acid, 3,5-dihydroxybenzoic acid, 2,6-dihydroxybenzoic acid, 3,4-dihydroxybenzoic acid, 3,4,5-trihydroxybenzoic acid, 2,3,4-trihydroxybenzoic acid, 6-hydroxy-2-toluic acid, 2-hydroxy-3-toluic acid, 5-hydroxy-3-toluic acid, 2-hydroxy-4-toluic acid, 2-hydroxy-3-isopropyl-6-methylbenzoic acid, 4-hydroxy-5-isopropyl-2-methylbenzoic acid, 2,4-dihyroxy-6-methylbenzoic acid, 2-hydroxyphthalic acid, 4-hydroxyisophthalic acid, 2-hydoxyterephthalic acid, 3,4-dihydroxyphthalic acid, 2,5-dihydroxyphthalic acid, 2-hydroxy-1,3,5-benzenetricaboxylic acid, (hydroxymethyl) benzoic acid, (1-hydroxy-1-methylethyl) benzoic acid, anisic acid, vanillic acid, 3-hydroxy-4-methoxybenzoic acid, 3,4-dimethoxybenzoic acid, 3,4-methylenedioxybenzoic acid, 3,4,5-trimethoxybenzoic acid, 3,4-dimthoxyphthalic acid, o-phenoxybenzoic acid, o-acetoxybenzoic acid, 3-o-galloylgallic acid, p-acetylbenzoic acid, p-benzoylbenzoic acid, 4,4'-carbonyldibenzoic acid, p-acetoamidebenzoic acid, o-benzoamidebenzoic acid, phthalanilic acid, phenylacetic acid, 2-phenylpropionic acid, 3-phenylpropionic acid, 4-phenylbutyric acid, p-hydroxyphenylacetic acid, 2,5-dihydroxyphenylacetic acid, 3-(o-hydroxyphenyl) propionic acid, 2,3-dibromo phenylpropionic acid, α-hydroxyphenylacetic acid, 2-hydroxy-2-phenylpropionic acid, 2-hydroxy-3-phenyl propionic acid, 3-hydroxy-2-phenylpropionic acid, 3-hydroxy-3-phenylpropionic acid, 2,3-epoxy-3-phenyl propionic acid, phenylsuccinic acid, o-carboxyphenyl acetic acid, 1,2-benzenediacetic acid, phenylglyoxylic acid, o-carboxyglyoxylic acid, phenylpyruvic acid, benzoylacetic acid, 3-benzoylpropionic acid, phenoxyacetic acid, benzoyloxyacetic acid, 2-benzoyloxypropionic acid, succinanilic acid, carbanylic acid, oxanilic acid, o-carboxyoxanilic acid, 4-biphenylcarboxylic acid, 2,2'-biphenyldicarboxylic acid, benzylbenzoic acid, diphenylacetic acid, α-hydroxydiphenylacetic acid, o-benzhydrylbenzoic acid, phenolphthalin, triphenylacetic acid, uvic acid, 5-methyl-2-furancarboxylic acid, 2-furancarboxylic acid, furilic acid, paraconic acid, terebic acid, terpenylic acid, aconic acid, coumalic acid, comanic acid, comenic acid, chelidonic acid, meconic acid, and the like.

The resist (1) according to the invention contains 0.5 to 20 wt %, more preferably 1 to 10 wt %, of the carboxylic acid, based on the total weight of the solid components of the resist (1). If the amount of the carboxylic acid used is less than 0.5 wt %, the resist can hardly be made into a resist film having a good pattern after exposed to a chemical radiation and subjected to development. On the other hand, if the amount of the carboxylic acid is more than 20 wt %, the difference in etching speed between a portion exposed to a chemical radiation and a portion not exposed thereto will be too small.

The resist (1) can comprise alkali-soluble polymer as a fourth component, in addition to the acid decomposable compound and the acid generator, and the carboxylic acid.

It is desirable that the alkali-soluble polymer is a resin containing aryl group or carboxy group, with hydroxy group introduced into it. Specific examples of the resin are: phenol novolac resin, cresol novolac resin, xylenol novolac resin, vinyphenol resin, isopropenylphenol resin, a copolymer of vinylphenol and at least one compound selected from the group consisting of acrylic acid, methacrylic acid derivative, acrylonitrile, styrene devivative or the like, a copolymer of isopropenylphenol and at least one compound slected from the group consisting of acrylic acid, methacrylic acid derivative, acrylonitrile, and styrene derivative, a copolymer of styrene derivative and at least one compound selected from the group consisting of acrylic resin, methacrylic resin, acrylic acid, methacrylic acid, maleic acid, maleic anhydride, and acrylnitrile, and silicon-containing compounds of any of the polymers specified here.

Of the polymers mentioned above, resins containing aromatic rings are preferred since they render the resist (1) sufficiently resistant to dry etching. For example, phenol novolac resin and creasol novolc resin are preferable. Specific examples of the alkali-soluble polymers are specified in Tables 6, 7 and 8 attached hereto. Also, a phenol resin can be used which has its transparency improved by being oxidized, thus containing quinone, and then by reducing the quinone thus formed.

It is desirable that the amount of the alkali-soluble polymer used be 90 parts by weight or less, preferably 80 parts by weight or less, where the total amount of the acid-decomposable compound and the alkali-soluble polymer is 100 parts by weight. If the polymer is used in an amount greater than 90 parts by weight, the difference in etching speed between a portion exposed to a chemical radiation and a portion not exposed thereto will be excessively small, inevitably decreasing the resolution of the resist (1).

The resist (1) can comprise, if necessary, a sensitizer, a dye, a surfactant, and a dissolution inhibitor, in addition to the acid decomposable compound, the acid generator, the carboxylic acid, and the alkali-soluble polymer.

The resist (1) is prepared by dissolving the acid decomposable compound, the acid generator, the carboxylic acid and the alkali-soluble polymer in an organic solvent, and by filtering the resultant solution. Examples of the organic solvent are: ketone-based solvents such as cyclohexanone, acetone, methyl ethyl ketone, and methyl isobutyl ketone; cellosolve-based solvents such as methyl cellosolve, methyl cellosolve acetate, ethyl cellosolve, ethyl cellosolve acetate, butyl cellosolve, and butyl cellosolve acetate; and ester-based solvents such as ethyl acetate, butyl acetate, isoamyl acetate, ethyl lactate, and methyl lactate. Other examples of the organic solvent are: N-methyl-2-pyrrolidone, dimethylformamide, dimethylactoamide, dimethylsulfoxide, and the like. The solvents, exemplified here, can be used singly or in combination. Each can contain an appropriate amount of xylene, toluene or aliphatic alcohol (e.g., isopropyl alcohol).

The resist (2) for forming patterns, according to the invention, comprises a compound having an acid decomposable substituent group (hereinafter called "acid decomposable compound"); a compound which generates acid when exposed to a chemical radiation (hereinafter referred to as "acid generator"); and carboxylic acid.

The acid decomposable compound can be any compound that is decomposed by acid to have its solubility to developing liquid changed. Specific examples of this compound are: phenol, cresol, xylenol, bisphenol A, bisphenol S, hydroxybenzophenone, 3,3,3',3'-tetramethyl-1,1'-spiroindan-5,6,7,5'6',7'-hexanol, phenolphthalein, polyvinylphenol, novolac resin, and the like. The hydroxyl group in these acid decomposable compound is esterified with a proper estrifying agent, or etherified with an appropriate etherifying agent. Examples of the ester or ether to be introduced into the compound are: methyl ester, ethyl ester, n-propyl ester, iso-propyl ester, tert-butyl ester, n-butyl ester, isobutyl ester, benzyl ester, tetrahydro pyranyl ether, benzyl ether, methyl ether, ethyl ether, n-propyl ether, iso-propyl ether, tert-butyl ether, aryl ether, methoxmethyl ether, p-bromophenacyl ether, trimethylsilyl ether, benzyloxycarbonyl ether, tert-butoxycarbonyl ether, tert-butylacetate, 4-tert-butylbenzil ether, and the like. It is desirable that the acid decomposable compound be one represented by the general formula (I) described above in connection with the resist (1).

The acid generator contained in resist (2) is similar to that used in the resist (1). The acid generator, which is used along with the carboxylic acid, can be one of various known compounds or a mixture thereof. Nonetheless, o-quinonediazide compound, also used in the resist (1), is preferred. In particular, 1-naphthoquinone-2-diazo-4-ester sulfonate is the most preferable. The acid generator should be used in an amount of 0.1 to 30 wt %, more preferably 0.5 to 20 wt %, based on the total weight of the solid components of the resist (2), for the same reason as a similar acid generator is used in the resist (1).

The carboxylic acid contained in the resist (2) is similar to the third component of the resist (1). It is desirable that the carboxylic acid be used in an amount of 0.5 to 20 wt %, more preferably 1 to 10 wt %, based on the total weight of the solid components of the resist (2), for the same reason as carboxylic acid is used in the resist (1).

The resist (2) can comprise an alkali-soluble polymer similar to that one used in the resist (1), in addition to the acid decomposable compound, the acid generator, and the carboxylic acid. The polymer should be used in an amount of 90 parts by weight or less, preferably 80 parts by weight or less, where the total amount of the acid-decomposable compound and the alkali-soluble polymer is 100 pats by weight, as in the case of the resist (1). If neither the acid-decomposable compound nor the acid generator is a polymer, it would be desirable that the alkali-soluble polymer, described above, be used as a fourth component of the resist (2).

The resist (2) can comprise, if necessary, a sensitizer, a dye, a surfactant, and a dissolution inhibitor, in addition to the acid decomposable compound, the acid generator, and the carboxylic acid.

The resist (2) is prepared by dissolving the acid decomposable compound, the acid generator, the carboxylic acid, and, if necessary, the alkali-soluble polymer and other components, in such an organic solvent as is used to prepare the resist (1), and by filtering the resultant solution.

The resist (3) for forming patterns, according to the invention, comprises: compound having an acid decomposable substituent group (hereinafter re ferred to as decomposable substituent group (hereinafter re ferred to as "acid-decomposable compound"); a compound which generates strong acid when exposed to a chemical radiation (hereinafter called "first acid generator"); and a compound which generates acid weaker than the strong acid, when exposed to a chemical radiation (hereinafter referred to as "second acid generator").

The acid-decomposable compound used in the resist (3) can be selected from those specified above as examples of the acid-decomposable compound used in the resist (2). Preferably, it is one represented by the formula (I).

The first acid generator is a compound which generates a strong acid having pK value of less than 3 (K is electrolytic dissociation constant), when it is exposed to a chemical radiation. The first acid generator can be a compound similar to the acid generator used in the resist (1). Preferable examples are the o-quinonediazide compounds specified in connection with the resist (1). Of these o-quinonediazide compounds, 1-naphthoquinoue-2-diazo-4-ester sulfonate is the most desirable.

The first acid generator is used in the resist (3), in an amount of, preferably, 0.1 to 20 wt %, more preferably 0.5 to 10 wt %. If it is used in an amount less than 0.1 wt %, the resist (3) will hardly have a sufficient light-sensitivity. If it is used in an amount of more than 20 wt %, the resist (3) will fail to form an uniform resist film, or the residue of this resist will likely be formed after the film of the resist is developed or etched.

The second acid generator is a compound which generates a weak acid having pK value of 3 or more (K is electrolytic dissociation constant), when it is exposed to a chemical radiation. Examples of this acid generator are: 1,2-naphthoquinonediazide-5-ester sulfonate, 5-diazo meldram's acid, a derivative of 5-diazo meldrum's acid, and a derivative of diazodimedone.

The second acid generator is used in an amount of 1 to 30 wt %, more preferably 5 to 20 wt %, based on the total weight of the solid components of the resist (3). If the second acid generator is used in an amount of less than 1 wt %, it will be difficult to prevent forming of a hardly soluble layer on the resultant resist film. On the other hand, if the second acid generator is used in an amount of more than 30 wt %, it will be difficult to form a uniform resist film, or there will be the risk that resist residue will be formed after the resist film of the resist is developed or etched.

The resist (3) can comprise a carboxylic acid similar to that one used in the resist (1) and an alkali-soluble polymer, used as fourth and fifth components, respectively, in addition to the acid-decomposable compound, the first acid generator and the second acid generator. The carboxylic acid should better be used in an amount of 0.5 to 20 wt %, more preferably 1 to 10 wt %, based on the total weight of the solid components of the resist (2), for the same reason as carboxylic acid is used in the resist (1). The alkali-soluble polymer should be used in an amount of 90 parts by weight or less, preferably 80 parts by weight or less, where the total amount of the acid-decomposable compound and the alkali-soluble polymer is 100 pats by weight, as in the case of the resist (1). If none of the acid-decomposable compound, the first acid generator and the second acid generator is a polymer, it would be desirable that the alkali-soluble polymer, described above, be used as a fifth component of the resist (3).

The resist (3) can comprise, if necessary, a sensitizer, a dye, a surfactant, and a dissolution inhibitor, in addition to the acid decomposable compound, the acid generator, and the carboxylic acid.

The resist (3) is prepared by dissolving the acid decomposable compound, the first acid generator and the second acid generator, and, if necessary, the carboxylic acid, the alkali-soluble polymer, and other components, in such an organic solvent as is used to prepare the resist (1), and by filtering the resultant solution.

The resist (4) for forming patterns, according to the present invention, comprises: a compound having an acid decomposable substituent group; and o-quinonediazide compound.

The acid-decomposable compound used in the resist (4) can be selected from those specified above as examples of the acid-decomposable compound used in the resist (2). Preferably, it is one represented by the formula (I).

The second component of the resist (4), i.e., o-quinonediazide compound, is similar to the acid generator used in the resist (1). A preferable example of o-quinonediazide compound is 1-naphthoquinone-2-diazo-4-ester sulfonate.

It is desirable that the second component be used in an amount of 0.1 to 30 wt %, preferably 0.5 to 20 wt %, based on the total weight of the solid components of the resist (2), for the same reason as the acid generator is used in the resist (1).

The resist (4) can comprise carboxylic acid similar to that carboxylic acid used in the resist (1) and an alkali-soluble polymer, as third and fourth components, respectively, in addition to the acid-decomposable compound and o-quinonediazide compound. The carboxylic acid should better be used in an amount of 0.5 to 20 wt %, more preferably 1 to 10 wt %, based on the total weight of the solid components of the resist (2), for the same reason as carboxylic acid is used in the resist (1). The alkali-soluble polymer should be used in an amount of 90 parts by weight or less, preferably 80 parts by weight or less, where the total amount of the acid-decomposable compound and the alkali-soluble polymer is 100 pats by weight, as in the case of the resist (1). If neither the acid-decomposable compound nor o-quinonediazide compound is a polymer, it would be desirable that the alkali-soluble polymer, described above, be used as a forth component of the resist (4).

The resist (4) can comprise, if necessary, a sensitizer, a dye, a surfactant, and a dissolution inhibitor, in addition to the acid decomposable compound, the acid generator, and the carboxylic acid.

The resist (4) is prepared by dissolving the acid decomposable compound and o-quinonediazide compound, and, if necessary, the carboxylic acid, the alkali-soluble polymer, and other components, in such an organic solvent as is used to prepare the resist (1), and by filtering the resultant solution.

A method of forming a pattern on a substrate, by using any one of the resists (1) to (4) according to the present invention, will now be described.

First, the resist is coated on a substrate by means of spin-coating or dipping. The resist, thus coated, is dried at 150° C. or less, preferably 70° to 120° C., thereby forming a film of the resist. The substrate is a silicon wafer, a silicon wafer having insulating layers, electrodes and wires formed on its surface, and thus having stepped portions, a blank mask, or a III-V compound semiconductor wafer (e.g., a GaAs wafer or an AlGaAs wafer).

Next, ultraviolet rays (preferably, deep-Uv) or an ionizing radiation is applied onto the resist film through a mask which has a desired pattern. In the case of the film made of the resist (1), for example, the acid generator generates an acid. The acid reacts with the acid-decomposable compound. Examples of the ultraviolet rays are: the beams emitted by a KrF, ArF, XeF or XeCl excimer laser and the i-line, h-line or g-line emitted by a mercury lamp. Examples of the ionizing radiation are: electron beams and X-rays. In the exposure process described above, the resist film can be scanned with an electron beam, not irradiated with ultraviolet rays or the ionizing radiation. If this is the case, no masks are unnecessary, and the electron beam is applied directly onto the resist film.

Thereafter, the resist film is heated to 70° to 160° C., preferably 80° to 150° C. During the heating, the reaction between the acid-decomposable compound and the acid generated by the acid generator is accelerated. The resist film is heated to a temperature within the range specified above, for the following reasons.

If the resist film is heated to a temperature lower than 70° C., the acid generated by the acid generator will fail to sufficiently react with the acid-decomposable compound. On the other hand, if the resist film is heated to a temperature higher than 160° C., both the exposed portions of the film and the unexposed portions thereof will be decomposed or hardened.

Then, the resist film, thus heated, is developed with an alkali aqueous solution, whereby a desired resist pattern is formed. Examples of the alkali aqueous solution are: inorganic alkali aqueous solutions such as aqueous solution of potassium hydroxide, aqueous solution of sodium hydroxide, aqueous solution of sodium carbonate, and aqueous solution of sodium silicate, sodium metasilicate; organic alkali aqueous solutions such as aqueous solution of tetramethylammonium hydroxide and aqueous solution of trimethylhydroxyethyl ammonium hydroxide; and a mixture of any of these compounds and alcohol, suractant or the like.

The resist pattern, thus formed, is washed with water, whereby the developing solution is removed. The resist pattern is finally dried, along with the substrate on which it is formed.

In the method of forming a resist pattern, described above, step baking can be carried out, in which the substrate is gradually heated after the development of the resist film, thereby bridging the resin component of the resist film. Alternatively, deep-UV curing can be performed, in which deep ultraviolet rays are applied to the resist film, while heating the film, thereby bridging the resin component of the resist film. Either process serves to improve the heat resistance of the resultant resist pattern.

According to the invention, the resist film can be immersed in a low-concentration alkali aqueous solution, either before or after it is exposed to a chemical radiation, and then can be subjected to developing. Once the resist film is treated with the low-concentration alkali aqueous solution, its unexposed portions will be dissolved at lower speeds, which increases the contrast of the resultant relief image. The alkali aqueous solution can be replaced by amine such as trimethylamine, triethanolamine or hexamethylsilazane. Instead of being immersed in amine, the resist film can be exposed to vapor of the amine. Moreover, the resist film can be exposed to an alkali aqueous solution and then, if necessary, be heat-treated.

Further, according to the invention, fog exposure can be conducted on the resist film, in which the entire surface of the resist film already pattern-exposed is exposed to light, while the film is being heated. The fog exposure decreases the speed with which the unexposed portions of the resist film are dissolved, thereby enhancing the resolution of the resist film.

Moreover, in the method of forming a resist pattern, a layer of acidic water-soluble polymer can be formed on the resist film prior to the exposure thereof, in the case where the film is made of either the resist (1) or the resist (4). More specifically, this layer is formed, by preparing an aqueous solution of the polymer by dissolving the polymer with pure water, then coating the aqueous solution on the resist film by means of spin coating or deposition, and finally drying the coated solution at 150° C. or less, preferably 120° C. or less. The layer, thus formed on the resist film, prevents a hardly soluble layer from being formed on the resist film.

Preferably, the acidic water-soluble polymer is one having carboxy group or sulfo group as a substituent group. Specific examples of the acidic water-soluble polymer are: polyacrylic acid, polymethacrylic acid, polystyrenesulfonic acid, polymalic acid, polyitaconic acid, ethylene-anhydrous maleic acid copolymer, ethylene-methacrylic acid copolymer, ethylvinylether-anhydrous maleic acid copolymer, and styrene-anhydrous maleic acid copolymer. These acidic water-soluble polymers can be used singly or in combination. When any of these polymers, that contains anhydrous maleic acid, is dissolved in pure water, the anhydrous bond is cleaved, forming carboxylic acid. As a result of this, the polymer will exhibit acidity.

The layer of acidic water-soluble polymer can contain a surfactant which serves as coating modifier.

It is desirable that the polymer layer have a thickness of 10 to 1,000 nm, more preferably 50 to 500 nm. If the layer is less than 10 nm thick, it may fail to prevent a hardly soluble layer from being formed on the resist film. If the layer is more than 1,000 nm thick, it may reduce the resolution of the resist film. The thickness of the polymer layer does not depend on the thickness of the resist film. Rather, it depends on the thickness of a hardly soluble layer that might be formed if the polymer layer were not formed.

The resist film having the polymer layer formed on it is exposed to a chemical radiation applied through a mask, then heated to a predetermined temperature, and finally developed with an alkali aqueous solution. During the developing process, the polymer layer is removed from the entire surface of the resist film, from both the exposed portions and the unexposed portions. Thereafter, either the exposed portions of the resist film or the unexposed portions thereof are removed from the substrate, whereby a resist pattern is formed. Alternatively, the polymer layer can be washed away with pure water prior to the development process, so that the resist film may thereafter be developed. In this case, it is possible to prevent the alkali concentration of the alkali aqueous solution (i.e., the developing solution) from being changed by the acidic water-soluble copolymer which form the layer on the resist film. This serves to form a resist pattern of high resolution.

In the resist (1) according to the invention, the acid generator performs two functions. It functions as a dissolution inhibitor in each unexposed portion of the resist film, and also generates acid in each exposed portion of the resist film. The acid-decomposable compound represented by the formula (I) is decomposed by the acid generated by the acid generator, generating carboxylic acid. Thus, this compound is more easily dissolved in the developing solution than otherwise. Hence, the compound of the formula (I) can be dissolved at a speed much higher than the compounds which have been hitherto used and which generates phenol when decomposed by acid. This follows that the exposed portions of the film made of resist (1) are dissolved much faster than the unexposed portions. Therefore, the resist (1) is highly sensitive and can be processed into a high-resolution resist pattern. Even if the acid generator is one which generates weak acid when exposed to a chemical radiation, the exposed portions of the resist film are dissolved faster still than the unexposed portions. In other words, a variety of acid generators can be used in this invention.

If the acid generator is o-quinonediazide compound, it will more effectively suppress the erosion of the substrate than does onium slat which is contained in the conventional resists. The use of o-quinonediazide compound is also advantageous in that it is less harmful than onium salt, rendering the resist (1) easy to handle. Moreover, unlike films of the conventional chemically amplified resists, a film of the resist (1) hardly has scars on its surface. Therefore, after a film of the resist (1) is developed and rinsed, it will have openings having a rectangular cross section, thus providing a fine resist pattern.

In the case the resist (1) contains carboxylic acid as the third component, it can be more readily dissolved in an alkali developing solution, thereby reducing the possibility that a hardly soluble layer is formed on the resist film as is inevitable with the chemically amplified resists. Also does this help the resist (1) to form a fine resist pattern which has openings each having a rectangular cross section.

Further, if the resist (1) contains an alkali-soluble resin as the fourth component, it is possible to control the solubility of the exposed portions of the film of the resist (1). Hence, the resist (1) according to the invention is highly light-sensitive and can, therefore, have high resolution.

In the resist (2) according to the invention, the acid generator plays two roles. It functions as a dissolution inhibitor in each unexposed portion of the resist film, and also generates acid in each exposed portion of the resist film. The acid, thus generated, reacts with the acid-decomposable compound, decomposing this compound. As a result, the exposed portion of the resist film are dissolved and removed, more readily than the unexposed portion, as the resist film is developed and rinsed. The resist (2) has high light-sensitivity and can, therefore, provide a fine resist pattern.

By virtue of its third component of the resist (2), i.e., carboxylic acid, the resist (2) is very soluble to an alkali developing solution. Thus, unlike films of chemically amplified resists, a film made of the resist (2) will hardly have a layer in its upper region, which has scars and is hard to dissolve. Obviously, the resist (2) serves to form a fine resist pattern which has openings each having a rectangular cross section.

If an alkali-soluble resin is used as the fourth component in the resist (2), it is possible to control the solubility this resist exhibits to the alkali developing solution. The resist (2) can, therefore, have an improved light-sensitivity and an enhanced resolution.

In the resist (3) according to the invention, the first acid generator, which generates a strong acid when exposed to a chemical radiation, plays two roles. It functions as a dissolution inhibitor in each unexposed portion of the resist film, and also generates strong acid in each exposed portion of the resist film. The strong acid, thus generated, reacts with the acid-decomposable compound, decomposing this compound. As a result, the exposed portion of the resist film are dissolved and removed more readily than the unexposed portion, as the resist film is developed and rinsed. The resist (3) has high light-sensitivity and can, therefore, provide a fine resist pattern.

The second acid generator contained in the resist (3), which generates weak acid when exposed to a chemical radiation, serves to decompose the acid-decomposable compound, either little or not at all. Nonetheless, it makes the resist (3) more easy to dissolve in the alkali developing solution, thereby increasing the solubility of the resist (3). In other words, the second acid generator helps to reduce the possibility that a hardly soluble layer is formed on the resist film as is inevitable with the chemically amplified resists. This enables the resist (3) to form a fine resist pattern which has openings each having a rectangular cross section.

In the resist (4) according to this invention, o-quinonediazide compound used as the second component, also performs two functions. It functions as a dissolution inhibitor in each unexposed portion of the resist film, and also generates acid in each exposed portion of the resist film. The acid, thus generated, reacts with the acid-decomposable compound, decomposing this compound. As a result, the exposed portion of the resist film are dissolved and removed more readily than the unexposed portion, as the resist film is developed and rinsed. The resist (4) has high light-sensitivity and can, therefore, provide a fine resist pattern. The second component of the resist (4), i.e., o-quinonediazide compound, suppresses the erosion of the substrate, more effectively than does onium slat which is contained in the conventional resists. The use of o-quinonediazide compound is also advantageous in that it is less harmful than onium salt, making the resist (4) easy to handle. Moreover, by virtue of o-quinonediazide compound, a film of the resist (4) hardly has scars on its surface, unlike films of the conventional chemically amplified resists. Therefore, after a film of the resist (4) is developed and rinsed, it will have openings having a rectangular cross section, thus providing a fine resist pattern.

Further, carboxylic acid, if used as the third component in the resist (4), renders the resist very soluble in an alkali developing solution. Thus, unlike films of chemically amplified resists, a film made of the resist (4) will hardly have a layer in its upper region, which has scars and is hard to dissolve. Hence, the resist (4) serves to form a fine resist pattern which has openings each having a rectangular cross section. If an alkali-soluble resin is used as the fourth component in the resist (4), it is possible to control the solubility the exposed portions of the resist film exhibit to the alkali developing solution. Thus, the alkali-soluble resin enables the resist (4) to have its light-sensitivity improved and its resolution enhanced.

The films of the resists (1) to (4) according to the invention can be subjected to the processes which have been hitherto conducted on positive-type resists containing naphthoquinone diazide, such as alkali treatment for improving the image contrast of a resist pattern to be formed, step baking or deep-Uv curing for enhancing the heat-resistance of a resist pattern to be formed. By performing these processes, other processes such as exposure and development can be effected under more arbitrary conditions than otherwise.

In the method of forming a resist pattern of the resist (1), (2), (3) or (4), the resist is coated on a substrate, thereby forming a resist film. The resist film is subjected to pattern exposure, whereby selected portions of the resist film are exposed to a chemical radiation. In the exposed portions of the resist film, the acid generator generates an acid as it is exposed to the chemical radiation. The acid, thus generated, reacts with the acid-decomposable compound in the exposed portions of the film, thereby decomposing the acid-decomposable compound. After the pattern exposure, the resist film is heated to a predetermined temperature, whereby the reaction of the acid with the acid-decomposable compound proceeds thoroughly from the exposed surface of the film to the unexposed surface thereof. As result, during the developing process which follows the heating process, each exposed portion of the resist film is dissolved and removed in its entirety, more readily than the unexposed portions. As a result, the resist film form a fine resist pattern which has openings having a rectangular cross section.

Particularly, in the case of a film made of the resist (2), the carboxylic acid increases the speed at which the resist (2) is dissolved with the alkali developing solution. In the case of a film made of the resist (3), the weak acid which the second acid generator generates when exposed to a chemical radiation increases the solubility the resist (3) exhibits to an alkali developing solution. In other words, the second acid generator helps to reduce the possibility that a hardly soluble layer is formed on the resist film as is inevitable with the chemically amplified resists. Therefore, the resist (3) can be processed, forming a fine resist pattern which serves to manufacture a semiconductor device having a high integration density.

In the method of forming a resist pattern of the resist (1) or (4), the resist is coated on a substrate, thus forming a resist film. A layer of acid-soluble polymer is formed on the resist film. Next, the resist film is pattern-exposed and heated to a predetermined temperature. In the exposed portions of the resist film, the acid generator generates acid. The acid reacts with the acid-decomposable compound. The reaction proceeds from the exposed surface of the resist film to the unexposed surface thereof. During this reaction, the acid-soluble polymer layer prevents undesired substances in the process atmosphere from contacting the resist film, whereby no hardly soluble layers, which are detrimental to chemically amplified resist films, will be formed on the resist film. Even if a hardly soluble layer is formed on the acid-soluble polymer layer, it will be dissolved along with the acid-soluble polymer layer when the resist film is developed after it has been pattern-exposed and heated. As a result, there will be formed a fine resist pattern which has openings having a rectangular cross section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1:
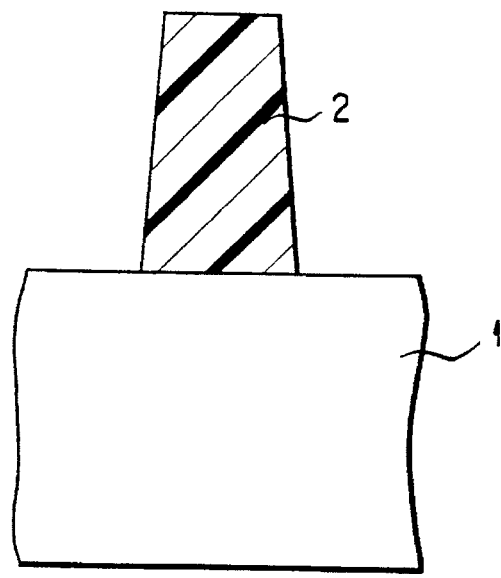
FIG. 1 is a cross-sectional view showing a pattern formed on a silicon wafer by means of Example 25 of the present invention.

Examples of the present invention will now be described in detail.

(Synthesis of Acid-Decomposable Compound)

First, 50 g of polyvinyl phenol (PHM-C manufactured by Maruzen Petrochemical) is dissolved with 200 ml of acetone in a 4-port flask filled with nitrogen gas, thereby preparing a solution. Next, 17.63 g of potassium carbonate, 8.48 g of potassium iodide, and 24.38 g of tert-butyl bromoacetate were added to the solution. The solution was then refluxed for 7 hours while being stirred. Thereafter, the insoluble matter was filtered out, and acetone was distilled out. The resultant substance was dissolved in 150 ml of ethanol, thus forming a solution. This solution was dropped into 1.5 l of water, thereby depositing the polymer. The polymer is filtered out and washed with water three times, every time with 300 ml of water. The polymer was then dried with wind for 12 hours. The polymer thus dried was dissolved in 200 ml of ethanol, precipitated, and refined. Further, the polymer was dried for 24 hours by means of a vacuum drier at 50° C., whereby 2.0 g of polymer was obtained. The results of $^1$H-NMR spectrum test showed that this polymer was tert-butoxycarbonyl methoxypolyhydroxy styrene in which 35% of the hydroxy group in polyvinyl phenol had changed into tert-butoxycarbonyl methyl ether. The polymer, thus obtained, is an acid 2-decomposable compound and will hereinafter be referred to as "Ba-35."

Six other polymers were prepared in the synthesized by the same method as the compound Ba-35. These polymers differ from each other and from the compound Ba-35 in terms of substitution ratio of hydroxy group, as is shown in Table 9 (later presented).

(Components of Resist)

Acid-decomposable compounds other than those shown in Table 9 are shown in Tables 10 to 15 (later presented). Compounds which generate strong acid when exposed to a chemical radiation are shown in Tables 16 and 17 (later presented). Compounds which generate weak acid when exposed to a chemical radiation are shown in Table 19 (later presented).

(Resist-Preparing Method 1)

2.0 g of the acid-decomposable compound Ba-35 shown in Table 9, 0.44 g of o-quinonediazide compound QD-4 shown in Table 1 (later presented), in which number of Xs is 3 per molecule, and 2.0 g of polyvinyl phenol were dissolved in 13.8 g of ethyl cellosolve acetate, thus forming a solution. The solution was filtered by a filter having a mesh size of 0.2 μm, thereby preparing resist RE-1.

(Resist-Preparing Methods 2 to 10)

The acid-decomposable compounds shown in Table 9, the o-quinonediazide compounds shown in Tables 3 to 5, and polyvinyl phenol were mixed in the ratios specified in Tables 20 and 21 (later presented), thus forming various mixtures. The mixtures were dissolved in the solvents shown in Tables 20 and 21 and used in the amounts specified in Tables 20 and 21, too, thereby preparing 9 different solutions. These solutions were filtered by a filter having a mesh size of 0.2 μm, thus preparing 9 resists RE-2 to RE-10. Also shown in Table 20 is the composition of the resist RE-1.

(Example 1)

The resist RE-1 was spin-coated on a 6-inch silicon wafer. The wafer was placed on a hot plate heated to 90° C. The resist RE-1 was pre-baked for 10 minutes, thereby forming a resist film having a thickness of 1.0 μm. Then, the resist film was pattern-exposed by means of an KrF excimer laser (NA: 0.45), and was baked for 5 minutes on a hot plate heated to 120° C. Next, the resist film was immersed in 1.59% aqueous solution of tetramethylammonium hydroxide (hereinafter abbreviated "TMAH") four 20 seconds, thus developing the film. Subsequently, the resist film was water-washed, and dried, whereby a resist pattern was formed.

(Examples 2 to 15)

The resists specified in Tables 20 and 21 were spin-coated on 6-inch silicon wafers. The resists were pre-baked under the different conditions—all shown in Tables 22 and 23. As a result, 14 resist films, each having a thickness of 1.0 μm, were formed on the silicon wafers. Further, each resist film was pattern-exposed by an KrF excimer-laser stepper, baked under the conditions shown in FIGS. 22 and 23. Each resist film was then developed, washed with water, whereby 14 types of resist patterns were formed.

The cross sections of the 15 resist patterns, thus formed, were observed by means of a scanning electronic microscope, in order to determine the resolution of each resist pattern. More precisely, the widths of the lines of the pattern and the gaps among the lines were measured. Also, the exposure amount applied to each resist film was measured. The results were as is shown in Tables 22 and 23, both later presented.

(Example 16)

The resist RE-1 specified in Table 20 was spin-coated on a 6-inch silicon wafer. The resist was pre-baked for 10 minutes on a hot plate heated to 90° C., thereby forming a resist film having a thickness of 1.0 μm, on the silicon substrate. The resist film, thus formed, was pattern-exposed by an KrF excimer-laser stepper (NA: 0.45), and was baked for 5 minutes on a hot plate heated to 120° C. Next, the resist film was immersed in 1.59% aqueous solution of TMAH for 45 seconds, thus developing the film. Subsequently, the resist film was water-washed, and dried. Further, the resist film was subjected to step baking on the hot plate, being heated stepwise from 120° C. to 180° C. over 10 minutes, whereby a resist pattern was formed.

The cross section of the resist pattern, thus made, was observed by means of a scanning electronic microscope, in order to determine the resolution of the resist pattern. More precisely, the widths of the lines of the pattern and the gaps among the lines were measured. Also, the exposure amount applied to the resist film was measured. It was found that the widths of the lines and the gaps among them were 0.35 μm and that the exposure amount was 40 mJ/cm$^2$.

The resist patterns of Examples 1 and 16 were heated on a hot plate to 180° C. for 5 minutes, and the cross sections of their lines having a width of 5 μm were observed by the scanning electron microscope. It was found that the top of each 5 μm-wide line of Example 1 was rounded, whereas the top of each 5 μm-wide line of Example 16 remained flat.

(Example 17)

The resist RE-1 specified in Table 20 was spin-coated on a 6-inch silicon wafer. The resist was pre-baked for 10 minutes on a hot plate heated to 90° C., thereby forming a resist film having a thickness of 1.0 μm, on the silicon wafer.

The resist film, thus formed, was pattern-exposed by an KrF excimer-laser stepper (NA: 0.45), and was baked for 5 minutes on a hot plate heated to 120° C. Next, the resist film was immersed in 1.59% aqueous solution of TMAH for 45 seconds, thus developing the film. Subsequently, the resist film was water-washed, and dried. Then, the resist film was exposed to light beams having wavelengths of 290 to 310 nm and applied from a mercury lamp through a filter for 2 minutes, while being heated to 110° C. on a hot plate in a nitrogen-gas atmosphere. A resist pattern was thereby formed.

The cross section of the resist pattern, thus formed, was examined under a scanning electron microscope. It was found that the pattern had lines and gaps among these lines—all having a width of 0.35 μm. The exposure amount applied to the resist film was 40 mJ/cm$^2$.

The resist pattern of Examples 1 and 17 were heated on a hot plate to 180° C. for 5 minutes, and the cross sections of its lines having a width of 5 μm were examined by the scanning electron microscope. It was found that the top of each 5 μm-wide line of Example 17 remained flat, not rounded as the top of the 5 μm-wide line of Example 1.

(Example 18)

The resist RE-1 specified in Table 20 was spin-coated on a 6-inch silicon wafer. The resist was pre-baked for 10 minutes on a hot plate heated to 90° C., thereby forming a resist film having a thickness of 1.0 μm, on the silicon wafer. The resist film was pattern-exposed by an KrF excimer-laser stepper (NA: 0.45), and was baked for 5 minutes on a hot plate heated to 120° C. Next, the resist film was immersed in 1.59% aqueous solution of TMAH for 15 seconds, thus developed, and was water-washed, and dried. Further, the resist film was again immersed in 1.59% aqueous solution of TMAH for 15 seconds, and was water-washed, and dried, thereby forming a resist pattern.

The cross section of the resist pattern, thus formed, was examined under a scanning electron microscope. It was found that the pattern had lines and gaps among these lines—all having a width of 0.30 μm. The exposure amount applied to the resist film was 50 mJ/cm$^2$.

(Example 19)

The resist RE-1 specified in Table 20 was spin-coated on a 6-inch silicon wafer. The resist was pre-baked for 10 minutes on a hot plate heated to 90° C., thereby forming a resist film having a thickness of 1.0 μm, on the silicon wafer. The resist film, thus formed, was pattern-exposed by an KrF excimer-laser stepper (NA: 0.45). Then, the resist film was exposed to light beams having wavelengths of 290 to 310 nm and applied from a mercury lamp through a filter for 5 minutes, while being heated to 110° C. on a hot plate in a nitrogen-gas atmosphere. Next, the resist film was immersed in 1.59% aqueous solution of TMAH for 45 seconds, thus developing the film. Subsequently, the resist film was water-washed, and dried. A resist pattern was thereby formed.

The cross section of the resist pattern (Example 19) was examined under a scanning electron microscope. It was found that the pattern had lines and gaps among these lines—all having a width of 0.30 μm. The exposure amount applied to the resist film was 55 mJ/cm$^2$.

(Resist-Preparing Method 11)

First, 50 g of the acid-decomposable compound Ba-20 shown in Table 9, and 0.025 g of the acid generator C-1 specified in Table 16 (later presented) were dissolved in 15.8 g of ethyl cellosolve acetate, thus forming a solution. This solution was filtered by a filter having a mesh size of 0.2 μm, thus preparing a resist (hereinafter referred to as "resist RE-11").

(Resist-Preparing Methods 12 to 19)

The acid-decomposable compounds shown in Table 9, the acid generators specified in Table 16, and, if necessary, an alkali-soluble polymer were mixed in the ratios specified in Tables 24 and 25 (later presented), thus forming various mixtures. The mixtures were dissolved in the solvents shown in Tables 24 and 25 and used in the amounts specified in these tables, too, thereby preparing 8 different solutions. These solutions were filtered by a filter having a mesh size of 0.2 μm, thus preparing 8 resists RE-12 to RE-19. Also shown in Table 24 is the composition of the resist RE-11.

(Example 20)

The resist RE-11 specified in Table 24 was spin-coated on a 6-inch silicon wafer. The resist was pre-baked for 90 seconds minutes on a hot plate heated to 95° C., thereby forming a resist film having a thickness of 1.0 μm, on the silicon wafer. A solution of an acidic water-soluble polymer containing methylvinyl etheranhydrous maleic acid was spin-coated on the resist film thus formed. The polymer was baked for 60 seconds on a hot plate heated to 90° C., thereby forming a polymer layer having a thickness of 0.15 μm. Then, the resist film was pattern-exposed by an KrF excimer-laser stepper (NA: 0.45). Next, the resist film was baked for 90 seconds on a hot plate heated to 95° C. Further, the film was washed with pure water, washing away the polymer layer. The resist film was then immersed in 0.14N TMAH aqueous solution for 90 seconds, thus developing the film. Subsequently, the resist film was water-washed, and dried. A resist pattern was thereby formed.

(Examples 21 to 24)

The resists specified in Table 24 (later presented) were spin-coated on 6-inch silicon wafers. The resists were pre-baked under the conditions shown in Table 26 (later presented), thereby forming resist films of four types, each having a thickness of 1.0 μm, on the silicon wafers. A solution of an acidic water-soluble polymer of the same type as was used in Example 20 was spin-coated on the resist films thus formed. The polymer on the resist films was baked for 60 seconds on a hot plate heated to 90° C., thereby forming four polymer layers having different thicknesses. More specifically, the layers of Examples 21, 23 and 24 had a thickness of 0.15 μm, whereas the layer of Example 22 had a thickness of 2.0 μm. Then, the resist films were pattern-exposed, baked and developed under the conditions specified in Table 26. Next, the resist films were washed with water and dried, whereby four types of resist patterns were formed.

The cross sections of the resist patterns of Examples 20 to 24, thus formed, were examined under a scanning electron microscope, measuring the widths of the lines forming each pattern and gaps among these lines. Also the exposure amounts applied to the resist films to form the resist patterns were detected. The results were as is represented in Table 26. As is evident from Table 26, the patterns of Examples 20 to 24 had openings having a rectangular cross section and had no scars on their tops.

(Example 25)

Positive resist (OFPR 800 manufactured by Tokyo Ohka Co., Ltd.) was spin-coated on a 6-inch silicon wafer. The resist was heated on a hot plate heated to 200° C., thereby forming a positive resist film having a thickness of 2.0 μm, on the silicon wafer. Then, the resist RE-16 specified in Table 26 was spin-coated on the positive resist film, thus forming a resist film having a thickness of 0.5 μm, on the positive resist film. A solution of an acidic water-soluble polymer of the same type as used in Example 20 was spin-coated on the resist film. The polymer was baked for 60 seconds on a hot plate heated to 90° C., whereby a polymer layer having a thickness of 0.15 μm was formed.

Then, the resist film covered with the polymer layer was pattern-exposed by an KrF excimer-laser stepper (NA: 0.50). Next, the resist film was pattern-exposed at the exposure amount of 25 mJ/cm$^2$. The film, thus pattern-exposed was baked for 180 seconds on a hot plate heated to 100° C. Further, the film was washed with pure water, washing away the polymer layer. The resist film was then immersed in 2.38% TMAH aqueous solution for 40 seconds, thus developing the film. Subsequently, the resist film was water-washed, and dried, whereby a resist pattern was formed.

Thereafter, the silicon wafer, with the resist pattern thus formed on its surface, was placed within a dry-etching apparatus (HiRRIE manufactured by Tokuda Seishakusho), and the positive resist film was subjected etching at $O_2$ 100 sccm, under the pressure of 6 Pa, and at the power of 300 W. The cross section of this resist pattern was examined by a scanning electron microscope, and was found to be a fine and sharp one, having lines and gaps among the lines which were all 0.28 μm wide.

(Example 26)

The resist RE-17 specified in Table 25 was spin-coated on a 6-inch silicon wafer. The resist was pre-baked for 180 seconds minutes on a hot plate heated to 90° C., thereby forming a resist film having a thickness of 1.0 μm, on the silicon wafer. A solution of an acidic water-soluble polymer of the same type used in Example 20 was coated on the resist film. The polymer thus coated was baked for 60 seconds on a hot plate heated to 90° C., thereby forming a polymer layer having a thickness of 0.15 μm. Then, the resist film was pattern-exposed by an KrF excimer-laser stepper (NA: 0.45). Next, the resist film was baked for 120 seconds on a hot plate heated to 120° C. Further, the film was washed with pure water, washing away the polymer layer. The resist film was then immersed in 2.38% TMAH aqueous solution for 30 seconds, thus developing the film. Subsequently, the resist film was water-washed, and dried, whereby a resist pattern was formed.

(Examples 27 to 30)

The resists specified in Tables 24 and 25 were spin-coated on 6-inch silicon wafers. The resists were pre-baked under the conditions shown in Table 27 (later presented), thereby forming resist films of four types, each having a thickness of 1.0 μm, on the silicon wafers. A solution of an acidic water-soluble polymer of the same type as was used in Example 20 was spin-coated on the resist films thus formed. The polymer on the resist films was baked for 60 seconds on a hot plate heated to 90° C., thereby forming four polymer layers having the same thicknesses of 0.14 μm. Then, these resist films were pattern-exposed, baked and developed under the conditions specified in Table 27. Next, the resist films were washed with water and dried, whereby four types of resist patterns were formed.

The cross sections of the resist patterns of Examples 26 to 30, thus formed, were examined under a scanning electron microscope, measuring the widths of the lines forming each pattern and gaps among these lines. Also the exposure amounts applied to the resist films to form the resist patterns were detected. The results were as is represented in Table 27. As can be clearly seen from Table 27, the patterns of Examples 26 to 30 had openings having a rectangular cross section and had no scars on their tops.

(Examples 31 to 34)

The acid-decomposable compounds, the o-quinonediazide compounds, and the alkali-soluble polymers—all specified in Table 28—were mixed, in the various combinations also shown in Table 28, thus forming four types of mixtures. Each mixture was dissolved in ethyl cellosolve acetate used in the amount specified in Table 28, too, thus preparing a solution. The solution was filtered by a filter having a mesh size of 0.2 μm. As a result, four types of resists were obtained.

The resists, thus obtained, were spin-coated on 6-inch silicon wafers. The resists were pre-baked under the conditions shown in Table 29 (later presented), thereby forming resist films of four types, each having a thickness of 1.0 μm, on the silicon wafers. Then, these resist films were pattern-exposed by means of an KrF excimer-laser stepper (NA: 0.45), baked and developed under the conditions specified in Table 29. Next, the resist films were washed with water and dried, whereby four types of resist patterns were formed.

The cross sections of the resist patterns of Examples 31 to 34, thus formed, were examined under a scanning electron microscope, measuring the widths of the lines forming each pattern and gaps among these lines. Also the exposure amounts applied to the resist films to form the resist patterns were detected. The results were as is represented in Table 29.

(Examples 35 to 39)

The acid-decomposable compounds, the o-quinonediazide compounds, and the alkali-soluble polymers—all specified in Table 30—were mixed, in the various combinations also shown in Table 30, thus forming five types of mixtures. Each mixture was dissolved in the solvent presented in Table 30 and used in the amount specified in the same table, thus preparing a solution. The solution was filtered by a filter having a mesh size of 0.2 μm. As a result, five types of resists were obtained.

The five resists, thus obtained, were spin-coated on 6-inch silicon wafers. The resists were pre-baked under the conditions shown in Table 31 (later presented), thereby forming resist films of five types, each having a thickness of 1.0 μm, on the silicon wafers. Then, these resist films were pattern-exposed by means of an KrF excimer-laser stepper (NA: 0.45), baked and developed under the conditions specified in Table 31. Next, the resist films were washed with water and dried, whereby five types of resist patterns were formed.

The cross sections of the resist patterns of Examples 35 to 39, thus formed, were examined under a scanning electron microscope, measuring the widths of the lines forming each pattern and gaps among these lines. Also the exposure amounts applied to the resist films to form the resist patterns were detected. The results were as is represented in Table 31, too.

(Examples 40 to 42)

The acid-decomposable compounds, the acid generators, and, if necessary, the alkali-soluble polymers—all specified in Table 32—were mixed in the various combinations also shown in Table 32, thereby preparing three types of mixtures. Each mixture was dissolved in ethyl cellosolve acetate used in the amount specified in Table 32, thus preparing a solution. The solutions were filtered by a filter having a mesh size of 0.2 μm. As a result, three types of light-sensitive resins were obtained.

The three resins, thus obtained, were spin-coated on 6-inch silicon wafers. The resins were pre-baked under the conditions shown in Table 33 (later presented), thereby forming resist films of five types, each having a thickness of 1.0 μm, on the silicon substrates. Then, these resist films were pattern-exposed by means of an KrF excimer-laser stepper (NA: 0.45), baked and developed under the conditions specified in Table 32. Next, the resist films were washed with water and dried, whereby three types of resist patterns were formed.

The cross sections of the resist patterns of Examples 40 to 42, thus formed, were examined under a scanning electron microscope, measuring the widths of the lines forming each pattern and gaps among these lines. Also the exposure amounts applied to the resist films to form the resist patterns were detected. The results were as is represented in Table 33, too.

(Examples 43 to 46)

The acid-decomposable compounds, the acid generators, the alkali-soluble polymers, if necessary, and the additives, if necessary—all specified in Table 34—were mixed in the various combinations also shown in Table 34, thereby preparing four types of mixtures. Each mixture was dissolved in ethyl cellosolve acetate used in the amount specified in Table 34, thus preparing a solution. The solution was filtered by a filter having a mesh size of 0.2 μm. As a result, four types of resists were obtained.

The four resists, thus obtained, were spin-coated on 6-inch silicon wafers. The resists were pre-baked under the conditions shown in Table 35 (later presented), thereby forming, resist films of four types, each having a thickness of 1.0 μm, on the silicon wafers. Then, these resist films were pattern-exposed by means of an KrF excimer-laser stepper (NA: 0.45), baked and developed under the conditions specified in Table 35. Next, the resist films were washed with water and dried, whereby four types of resist patterns were formed.

The cross sections of the resist patterns of Examples 43 to 46, thus formed, were examined under a scanning electron microscope, measuring the widths of the lines forming each pattern and gaps among these lines. Also the exposure amounts applied to the resist films to form the resist patterns were detected. The results were as is represented in Table 35.

(Example 47)

First, 9.5 g of the acid-decomposable compound Ba-25 specified in Table 9 and 0.5 g of 1-naphthoquinone-2-diazo-4-ester sulfonate of p-cyanophthalate were dissolved in 40 g of ethyl-3-ethoxypropionate, thus forming a solution. This solution was filtered by a filter having a mesh size of 0.2 μm, whereby a resist was prepared.

The resist, thus prepared, was spin-coated on a 6-inch silicon wafer. The resist was pre-baked for 3 minutes on a hot plate heated to 90° C., thereby forming a resist film having a thickness of 1.0 μm, on the silicon wafer. Then, the resist film was pattern-exposed by means of an i-line stepper (NA: 0.50), baked for 2 minutes on a hot plate heated to 110° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern was examined under a scanning electron microscope, and was found to have lines and gaps among the lines which were all 0.40 μm wide. It should be noted that the resist film had been pattern-exposed at the exposure amount of 50 mJ/cm$^2$.

(Example 48)

First, 4.0 g of the acid-decomposable compound Ba-25 specified in Table 9 and 0.21 g of 1-naphthoquinone-2-diazide-4-ester sulfonate of 4,4'-dihydroxy diphenylsulfide, (esterification number: 3 per molecule) were dissolved in 12.6 g of ethyl-3-ethoxypropionate, thus forming a solution. This solution was filtered by a filter having a mesh size of 0.2 μm, whereby a resist was obtained. This resist was processed by the same method as Example 47, thus forming a resist pattern.

The cross section of the resist pattern was examined under a scanning electron microscope, and was found to have lines and gaps among the lines which were all 0.40 μm wide. It should be noted that the resist film had been pattern-exposed at the exposure amount of 65 mJ/cm$^2$.

(Example 49)

First, 4.0 g of the acid-decomposable compound Ba-30 shown in Table 9 and 0.21 g of 1-naphthoquinone-2-diazide-4-ester sulfonate of 2,4-dihydroxy diphenyl sulfide, (esterification number: 1.5 per molecule) were dissolved in 12.5 g of ethyl cellosolve acetate, preparing a solution. This solution was filtered by a filter having a mesh size of 0.2 μm, whereby a resist was obtained.

The resist, thus obtained, was spin-coated on a 6-inch silicon wafer. The resist was pre-baked for 3 minutes on a hot plate heated to 90° C., thereby forming a resist film having a thickness of 1.0 μm, on the silicon wafer. Then, the resist film was pattern-exposed by means of an KrF excimer-laser stepper (NA: 0.45), baked for 2 minutes on a hot plate heated to 120° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern was examined under a scanning electron microscope, and was found to have lines and gaps among the lines which were all 0.35 μm wide. It should be noted that the resist film had been pattern-exposed at the exposure amount of 75 mJ/cm$^2$.

(Example 50)

First, 4.0 g of the acid-decomposable compound Ba-25 specified in Table 9 and 0.20 g of 1-naphthoquinone-2-diazide-4-ester sulfonate of 3,4,5-trihydoxy methylbenzoate (esterification number: 3 per molecule) were dissolved in 12.5 g of ethyl lactate, thus preparing a solution. This solution was filtered by a filter having a mesh size of 0.2 μm, whereby a resist was obtained. This resist was processed by the same method as Example 49, thus forming a resist pattern.

The cross section of the resist pattern was examined under a scanning electron microscope, and was found to have lines and gaps among the lines which were all 0.35 μm wide. It should be noted that the resist film had been pattern-exposed at the exposure amount of 85 mJ/cm$^2$.

(Example 51)

First, 4.0 g of the acid-decomposable compound Ba-25 shown in Table 9, 0.22 g of the o-quinonediazide compound QD-4, and 0.22 g of the o-quinonediazide compound QD-5, both o-quionediazide compounds specified in Table 1 and the same esterification number of 3 per molecule, were dissolved in 13.5 g of ethyl cellosolve acetate, thus preparing a solution. This solution was filtered by a filter having a mesh size of 0.2 μm, whereby a resist was obtained.

The resist, thus formed, was spin-coated on a 6-inch silicon wafer. The resist was pre-baked for 3 minutes on a hot plate heated to 90° C., thereby forming a resist film having a thickness of 1.0 μm, on the silicon wafer. Then, the resist film was pattern-exposed by means of an KrF excimer-laser stepper (NA: 0.50), baked for 90 seconds on a hot plate heated to 110° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern was examined under a scanning electron microscope, and was found to have lines and gaps among the lines which were all 0.35 µm wide. It should be noted that the resist film had been pattern-exposed at the exposure amount of 100 mJ/cm$^2$.

(Example 52)

First, 4.0 g of the acid-decomposable compound Ba-35 shown in Table 9, 0.20 g of diphenyliodonium trifluoromethane sulfonate, and 0.13 g of 4-hydroxy benzoic acid were dissolved in 13 g of ethyl cellosolve acetate, preparing a solution. The solution, was filtered by a filter having a mesh size of 0.2 µm, whereby a resist was obtained.

The resist, thus obtained, was spin-coated on a 6-inch silicon wafer. The resist was pre-baked for 5 minutes on a hot plate heated to 90° C., thereby forming a resist film having a thickness of 1.0 µm, on the silicon wafer. Then, the resist film was pattern-exposed by means of an KrF excimer-laser stepper (NA: 0.41), baked for 3 minutes on a hot plate heated to 100° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern, thus formed, was examined under a scanning electron microscope, and was found to have lines and gaps among the lines which were all 0.35 µm wide. It should be noted that the resist film had been pattern-exposed at the exposure amount of 30 mJ/cm$^2$. As is evident from FIG. 1, the the pattern of Examples 52 had no hardly soluble layers having scars, and was a fine resist pattern.

(Comparative Example)

First, 5 g of an acid-decomposable compound B-12 shown in Table 14 and 0.05 g of an acid generator C-2 shown in Table 16 were dissolved in 15 g of ethyl cellosolve acetate, thus preparing a solution. This solution was filtered by a filter having a mesh size of 0.2 µm, whereby a resist was obtained. The resist was processed by the same method as Example 52, thus forming a resist pattern.

Figure 2:
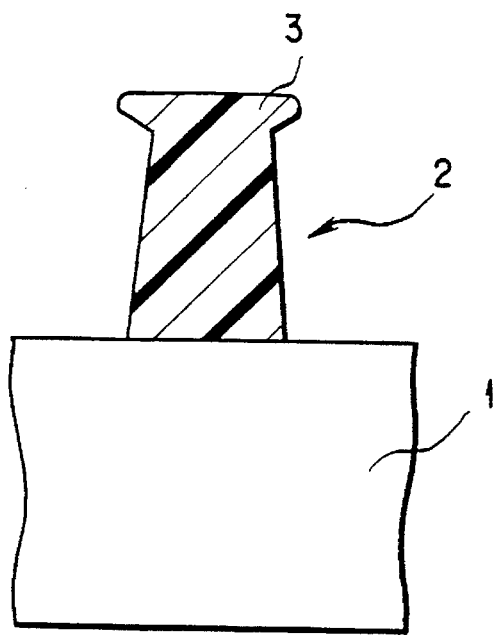
FIG. 2 is a cross-sectional view showing a pattern formed on a silicon wafer by means of a comparative example.

The cross section of the resist pattern, thus formed, was examined under a scanning electron microscope, and was found to have lines and gaps among the lines which were all 0.40 µm wide. It should be noted that the resist film had been pattern-exposed at the exposure amount of 25 mJ/cm$^2$. As is evident from FIG. 2, the the pattern 2 of the Comparative Example had a hardly soluble layer 3 having scars (Example 53)

First, 3.0 g of the acid-decomposable compound Ba-25 shown in Table 9, 0.44 g of o-quinonediazide compound QD-4 shown in Table 1, in which number of Xs per molecule, 1.0 g of polyvinyl phenol, and 0.25 g of acetic acid were dissolved in 13.8 g of ethyl cello solve acetate, thus preparing a solution. The solution was filtered by a filter having a mesh size of 0.2 µm, thereby obtaining a resist.

The resist was spin-coated on a 6-inch silicon wafer. The resist was pre-baked for 3 minutes on a hot plate heated to 90° C., thereby forming a resist film having a thickness of 1.0 µm, on the silicon wafer. Then, the resist film was pattern-exposed by means of an KrF excimer-laser stepper (NA: 0.42), baked for 2 minutes on a hot plate heated to 120° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern was examined under a scanning electron microscope, and was found to have lines and gaps among the lines which were all 0.30 µm wide. It should be noted that the resist film had been pattern-exposed at the exposure amount of 50 mJ/cm$^2$.

(Example 54)

A resist of the same type as Example 53 was spin-coated on a 6-inch silicon wafer. The resist was pre-baked for 3 minutes on a hot plate heated to 90° C., thereby forming a resist film having a thickness of 1.0 µm, on the silicon wafer. Then, the resist film was pattern-exposed by means of an i-line stepper (1505i7A manufactured by Nicon Co., Ltd), baked for 1 minutes on a hot plate heated to 120° C. Next, the resist film was immersed in 2.38% TMAH aqueous solution for 30 seconds, thus developing the film. Subsequently, the resist film was water-washed, and dried, whereby a resist pattern was formed.

The cross section of the resist pattern was examined under a scanning electron microscope, and was found to have lines and gaps among the lines which were all 0.40 µm wide. It should be noted that the resist film had been pattern-exposed for a period of 10 msec.

(Examples 55 to 58)

The acid-decomposable compounds, the acid generators, the alkali-soluble polymers, if necessary, and the carboxylic acids—all specified in Table 36—were mixed in the various combinations also shown in Table 36, thereby preparing four types of mixtures. Each mixture was dissolved in ethyl cello solve acetate used in the amount specified in Table 36, thus preparing four solutions. The solution was filtered by a filter having a mesh size of 0.2 µm. As a result, four types of resists were obtained.

The four resists were spin-coated on 6-inch silicon wafers. The resists were pre-baked under the conditions shown in Table 37, thereby forming resist films of four types, on the silicon substrates. Then, these resist films were pattern-exposed by means of an KrF excimer-laser stepper (NA: 0.45), baked and developed under the conditions specified in Table 37. Next, the resist films were washed with water and dried, whereby four types of resist patterns were formed.

The cross sections of the resist patterns of Examples 55 to 58, thus formed, were examined under a scanning electron microscope, measuring the widths of the lines forming each pattern and gaps among these lines. Also the exposure amounts applied to the resist films to form the resist patterns were detected. The results were as is represented in Table 37.

(Examples 59 to 62)

The acid-decomposable compounds, the acid generators, the alkali-soluble polymers, if necessary, and the carboxylic acids—all specified in Table 38—were mixed in the various combinations also shown in Table 38, thereby preparing four types of mixtures. Each mixture was dissolved in the solvents specified in Table 38 and used in the amount specified in Table 38, thus preparing four solutions. The solutions were filtered by a filter having a mesh size of 0.2 µm. As a result, four types of resists were obtained.

The four resists, thus obtained, were spin-coated on 6-inch silicon wafers. The resists were pre-baked under the conditions shown in Table 39, thereby forming resist films of four types, on the silicon wafers. Then, these resist films were pattern-exposed by means of an KrF excimer-laser stepper (NA: 0.45), baked and developed under the conditions specified in Table 39. Next, the resist films were washed with water and dried, whereby four types of resist patterns were formed.

The cross sections of the resist patterns of Examples 59 to 62, thus formed, were examined under a scanning electron microscope, measuring the widths of the lines forming each pattern and gaps among these lines. Also the exposure amounts applied to the resist films to form the resist patterns were detected. The results were as is represented in Table 39, too.

The resist patterns of Examples 55 to 62 had each openings having a rectangular cross section and had no scars on their tops.

(Resist-Preparing Method 21)

First, 5.0 g of the acid-decomposable compound Ba-20 specified in Table 9, 0.025 g of the strong acid generator C-1 shown in Table 16, and 0.56 g of the weak acid generator D-2 specified in Table 18 were dissolved in 16.7 g of ethyl lactate, preparing a solution. The solution was filtered by a filter having a mesh size of 0.2 μm, whereby a resist RE-21 was prepared.

(Resist-Preparing Methods 22 to 30)

The acid-decomposable compounds shown in Table 9, the strong acid generators specified in Table 16, the weak acid generators specified in Table 18, and, if necessary, the alkali-soluble polymers shown in Tables 40 and 41 and used in the amounts specified in Tables 40 and 41, were mixed, forming nine mixtures. These mixtures were dissolved in the various solvents shown in Tables 40 and 41 and used in the amounts also shown in Tables 40 and 41, preparing nine solutions. These solutions were filtered by a filter having a mesh size of 0.2 μm, whereby nine resists RE-22 to RE-30 were obtained. The composition of the resist RE-21 is also presented in Table 40.

(Example 63)

The resist RE-21 specified in Table 40 was spin-coated on a 6-inch silicon wafer. The resist was pre-baked for 90 seconds on a hot plate heated to 90° C., thereby forming a resist film having a thickness of 1.0 μm, on the silicon wafer. Then, the resist film was pattern-exposed by means of an KrF excimer-laser stepper (NA: 0.42), baked for 90 seconds on a hot plate heated to 95° C. Next, the resist film was immersed in 1.19% TMAH aqueous solution for 90 seconds, thus developing the film. Subsequently, the resist film was water-washed, and dried, whereby a resist pattern was formed.

(Examples 64 to 71)

The resists specified in Tables 40 and 41 were spin-coated on 6-inch silicon wafers. The resists were pre-baked under the conditions shown in Tables 42 and 43, thereby forming resist films of eight types, on the silicon wafers. Then, these resist films were pattern-exposed, baked and developed under the conditions specified in Tables 42 and 43. The resist films were washed with water and dried, whereby eight types of resist patterns were formed.

The cross sections of the resist patterns of Examples 63 to 71, thus formed, were examined under a scanning electron microscope, measuring the widths of the lines forming each pattern and gaps among these lines. Also the exposure amounts applied to the resist films to form the resist patterns were detected. The results were as is represented in Tables 42 and 43, too.

(Example 72)

A positive resist (OFPR 800 manufactured by Tokyo Ohyoka Co., Ltd.) was spin-coated on a 6-inch silicon wafer. The resist was pre-baked for 30 minutes on a hot plate heated to 200° C., thereby forming a positive resist film having a thickness of 2.0 μm, on the silicon wafer. Further, the resist RE-30 specified in Table 41 was spin-coated on the positive resist film, forming a resist film having a thickness of 0.5 μm. Then, the resist film was pattern-exposed by means of an i-line stepper (NA: 0.50) at exposure amount of 45 mJ/cm$^2$, baked for 180 seconds on a hot plate heated to 100° C. Next, the resist film was immersed in 2.38% TMAH aqueous solution for 40 seconds, thus developing the film. Subsequently, the resist film was water-washed, and dried, whereby a resist pattern was formed.

Thereafter, the silicon wafer, with the resist pattern thus formed on its surface, was placed within a dry-etching apparatus (HiRRIE manufactured by Tokuda Seishakusho), and the positive resist film was subjected to etching at $O_2$ 100 sccm, under the pressure of 6 Pa, and at the power of 300 W. The cross section of this resist pattern was examined by a scanning electron microscope, and was found to be a fine and sharp one, having lines and gaps among the lines which were all 0.35 μm wide.

As has been described, the present invention can provide a resist which is greatly sensitive to ultraviolet rays (preferably, deep-UV) or an ionizing radiation, and which can therefore form a high-resolution resist pattern if exposed to ultraviolet rays or an unionizing radiation. Also, the invention can provide a method of manufacturing fine resist patterns, each having openings having a rectangular cross section. Thus, the resist can be useful to the manufacture of semiconductor devices having high integration densities.

Additional advantages and modifications will readily occur to those skilled in the art. Therefore, the invention in its broader aspects is not limited to the specific details, and representative resist shown and described herein. Accordingly, various modifications may be made without departing from the spirit or scope of the general inventive concept as defined by the appended claims and their equivalents.

TABLE 1

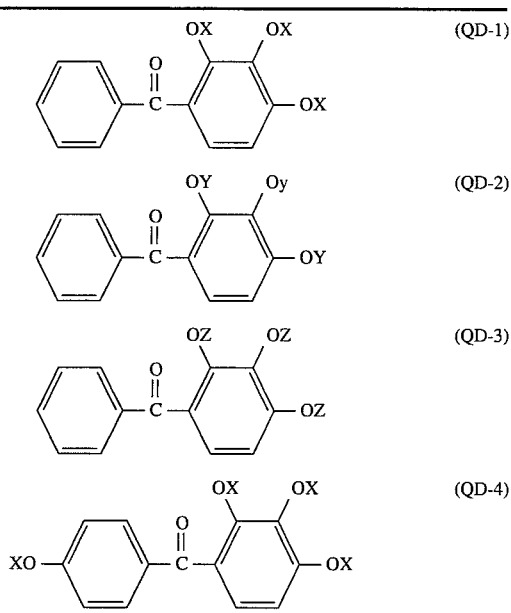

TABLE 1-continued
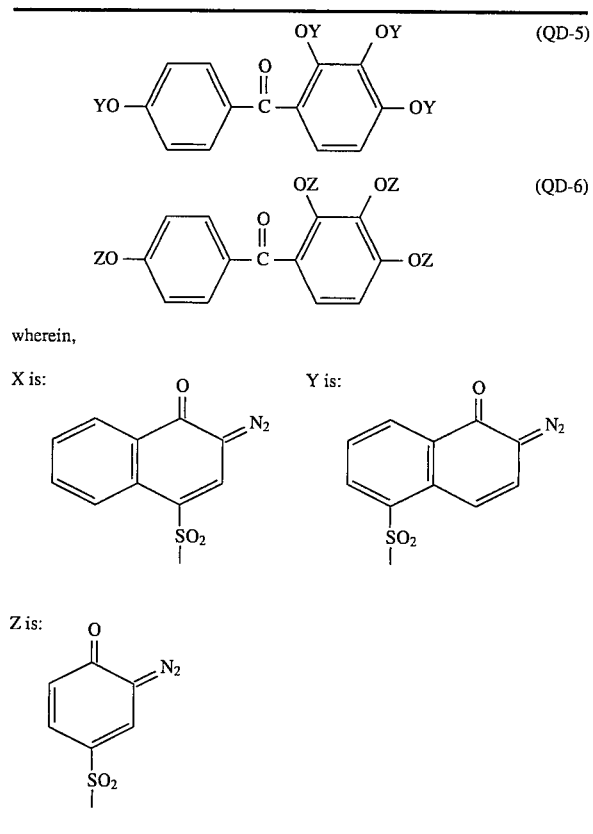
wherein,
X is: , Y is:
Z is:
TABLE 2
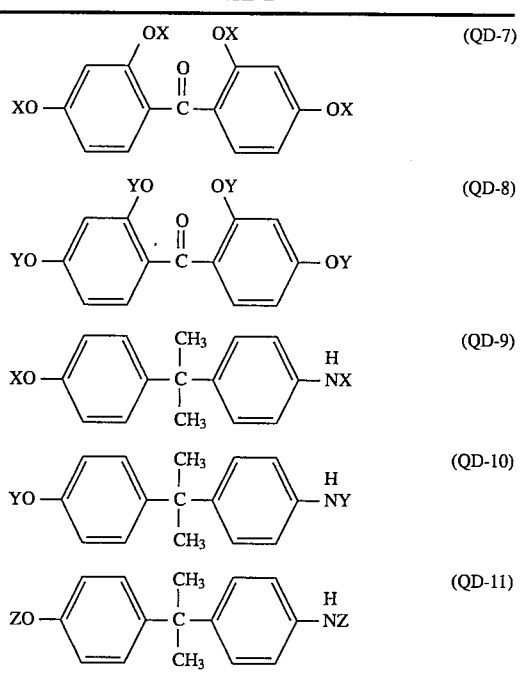
TABLE 2-continued
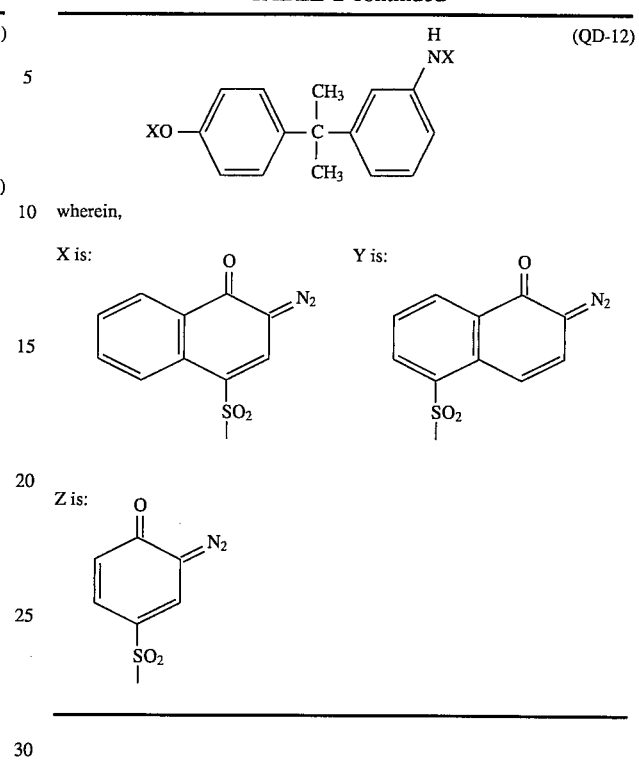
wherein,
X is: , Y is:
Z is:
TABLE 3
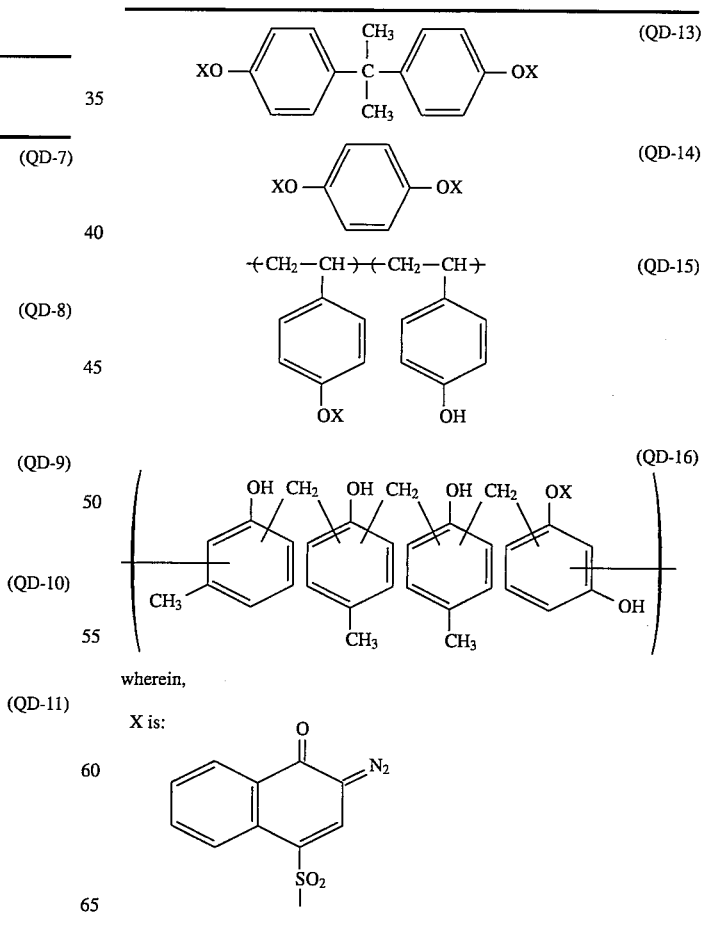
wherein,
X is:

TABLE 4

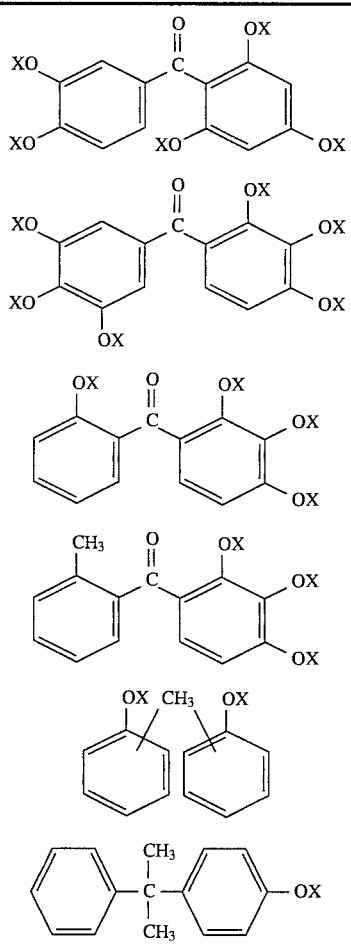

(QD-17)
(QD-18)
(QD-19)
(QD-20)
(QD-21)
(QD-22)

wherein,

X is:

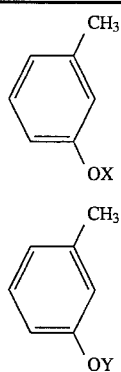

TABLE 5

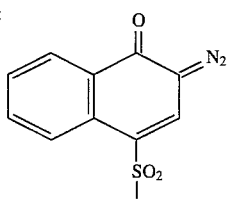

(QD-23)

(QD-24)

TABLE 5-continued

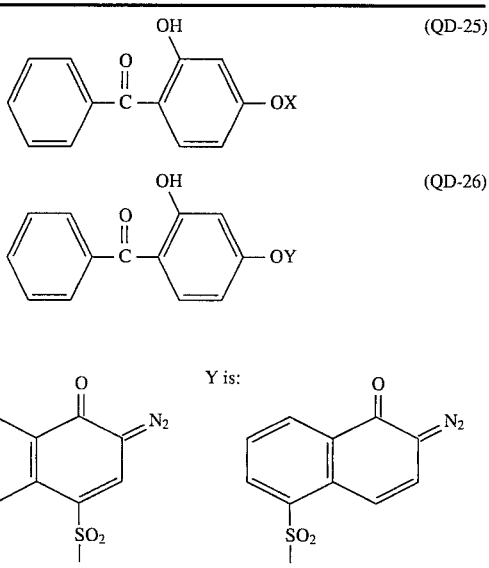

(QD-25)
(QD-26)

wherein,

X is:    Y is:

TABLE 6

(Alkali-soluble polymer)
- J-1 Poly-p-vinylphenol
- J-2 Poly-o-vinylphenol
- J-3 Poly-m-isopropenylphenol
- J-4 m, p-cresol novolac resin
- J-5 xylesol movolac resin
- J-6 p-vinylphenol-methyl methacrylate copolymer
- J-7 p-isopropenylphenol-maleic anhydride copolymer
- J-8 polymethacrylic acid
- J-9; Poly-p-hydroxystyrene

TABLE 7

(Alkali-soluble polymer)

J-10; 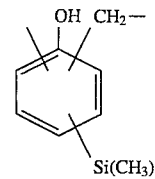

J-11; 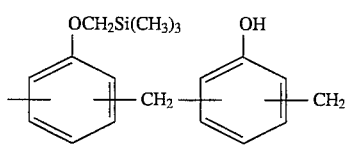

J-12; 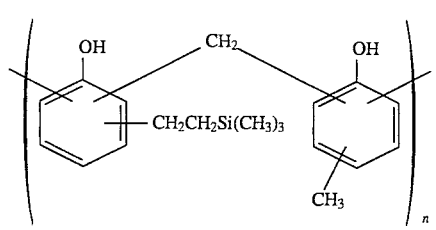

TABLE 7-continued
(Alkali-soluble polymer)
J-13;
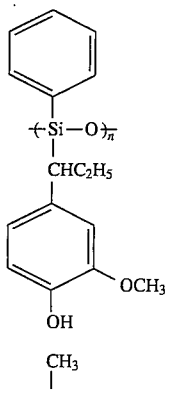
J-14;
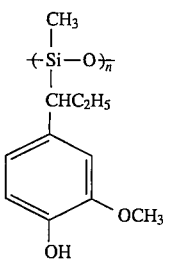
TABLE 8
(Alkali-soluble polymer)
J-15;
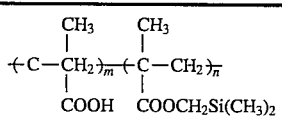
J-16;
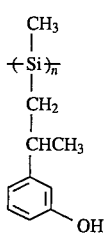
J-17;
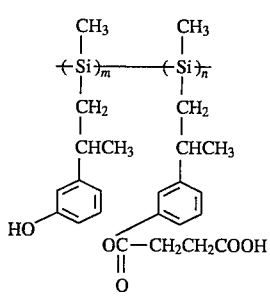
J-18;
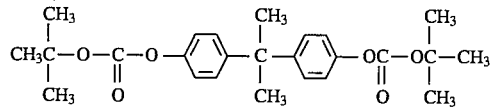
TABLE 9
(Acid-decomposable compounds)
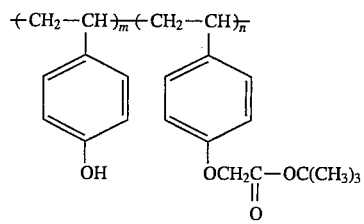
| Acid-decomposable Compound | n/(m + n) |
|---|---|
| Ba - 17 | 0.17 |
| Ba - 20 | 0.20 |
| Ba - 25 | 0.25 |
| Ba - 30 | 0.30 |
| Ba - 35 | 0.35 |
| Ba - 42 | 0.42 |
| Ba - 60 | 0.60 |
TABLE 10
(Acid-decomposable compounds)
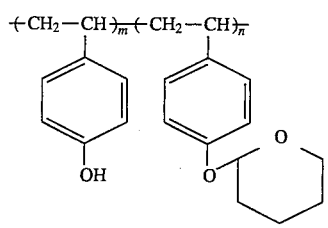
| Acid-decomposable Compound | n/(m + n) |
|---|---|
| Ba - 20 | 0.20 |
| Ba - 25 | 0.25 |
TABLE 11
(Acid-decomposable compounds)
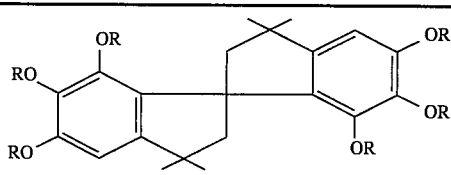
R: —CH$_2$CO$_2$tBu
(B-1)
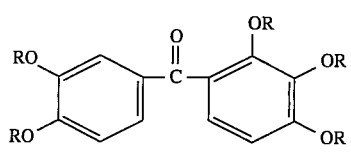
R: —CH$_2$CO$_2$tBu
(B-2)

TABLE 11-continued
(Acid-decomposable compounds)
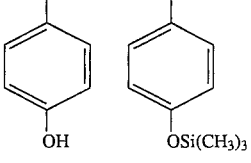 (B-3)
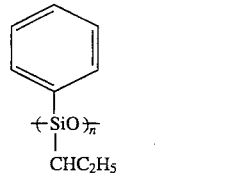 (B-4)
R: —CH$_2$CO$_2$tBu
TABLE 12
(Acid-decomposable compounds)
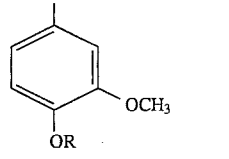 (B-5)
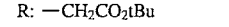 (B-6)
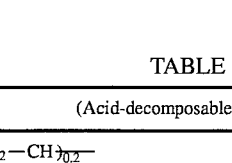 (B-7)
R: —CH$_2$COC(CH$_3$)$_3$
TABLE 13
(Acid-decomposable compounds)
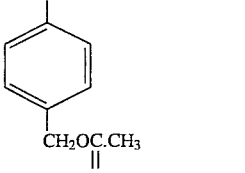 (B-8)
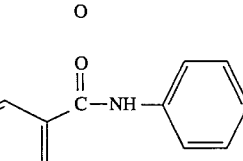 (B-9)
R: —CH$_2$COC(CH$_3$)$_3$

TABLE 14

(Acid-decomposable compounds)

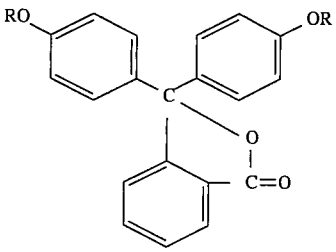
(B-10)

R: —COC(CH$_3$)$_3$
      ‖
      O

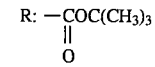
(B-11)

R: —CH$_2$CO$_2$tBu

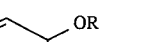
(B-12)

R: —COtBu
    ‖
    O

TABLE 15

(Acid-decomposable compounds)

(B-13)

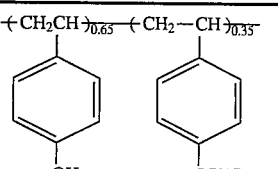
(B-14)

TABLE 16

(Acid(strong acid)-generating compounds)

C-1; Triphenylsulfonium trifluoromethanesulfonate
C-2; Diphenyliodionium trifluoromethanesulfonate
C-3; 2,3,4,4'-tetra hydroxybenzophenone 1,2-naphthoquinone-diazide-4-sulfonic acid ester (average esterification number: 3 per molecule)
C-4; P-toluenesulfonic acid-2,6-dinitrobenzyl ester
C-5; Bis(phenylsulfonyl)methane
C-6; Bis(phenylfonyl)diazomethane
C-7; Bis(4-tert butylphenyl)iodonium trifluoromethane sulfonate
C-8; Tert-butyl-d(p-toluenesalfonyloxy)acetate

TABLE 17

Acid (strong acid)-generating compounds

C-9;

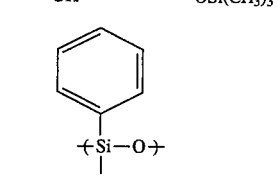

C-10;

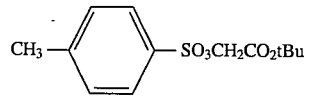

TABLE 18

(Weak acid-generating compounds)

D-1; 2,3,4,4'-tetra hydroxybenzophenone 1,2-naphthoquinone-diazide-5-sulfonic acid ester (esterification number: 3 per molecule)

D-2; 5-diazo meldrum's acid

D-3;

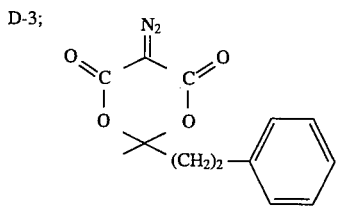

D-4;

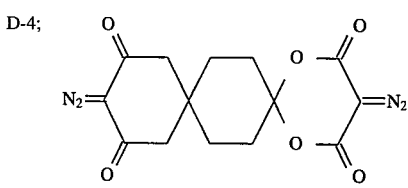

D-5;

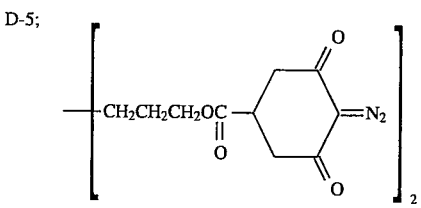

TABLE 18-continued (Weak acid-generating compounds)

D-6; $[(CH_3)_2C\text{—}CH_2OC(=O)\text{—}\underset{\substack{\|\\O}}{\overset{\substack{O\\\|}}{C_6H_6}}(=N_2)]_2$ (cyclohexane-1,3-dione with =N$_2$)

TABLE 19

(Additives)

(W-1) PhCH=C(N=C(CH$_3$)$_2$)C(=O)O— (enol ester structure)

(W-2) PhCH=C(N=CHPh)C(=O)O—

(W-3) (CH$_3$)$_2$C=C(N=CHPh)C(=O)O—

TABLE 20

| | Composition of the Resist | | | |
|---|---|---|---|---|
| Resist | Acid-Decomposable Compound (Table 9) and Amount Thereof Used | O-quinoneazide (Tables 1 and 4) and Amount Thereof Used | Amount of Polyvinylphenol Used | Solvent and Amount Thereof Used |
| RE-1 | Ba-35 (2.0 g) | QD-4 (0.44 g) | 2.0 g | Ethyl Cellosolve Acetate (13.8 g) |
| RE-2 | Ba-35 (2.0 g) | QD-4 (0.21 g) | 2.0 g | Ethyl Cellosolve Acetate (13.8 g) |
| RE-3 | Ba-25 (2.0 g) | QD-1 (0.44 g) | 2.0 g | Ethyl Cellosolve Acetate (14.0 g) |
| RE-4 | Ba-25 (2.7 g) | QD-4 (0.44 g) | 1.3 g | Ethyl Cellosolve Acetate (14.0 g) |
| RE-5 | Ba-25 (2.7 g) | QD-20 (0.44 g) | 1.3 g | Ethyl Cellosolve Acetate (14.0 g) |

TABLE 21

| Resist | Acid-Decomposable Compound (Table 9) and Amount Thereof Used | O-quinoneazeide (Tables 1, 3 and 5) and Amount Thereof Used | Amount of Polyvinylphenol Used | Solvent and Amount Thereof Used |
|---|---|---|---|---|
| RE-6 | Ba-25 (3.0 g) | QD-18 (0.25 g) | 1.0 g | Ethyl Cellosolve Acetate (14.0 g) |
| RE-7 | Ba-17 (4.0 g) | QD-4 (0.44 g) | — | Ethyl Cellosolve Acetate (14.0 g) |
| RE-8 | Ba-35 (2.0 g) | QD-4 (0.21 g) | 2.0 g | ECA-NMP* (14.0 g) |
| RE-9 | Ba-42 (1.6 g) | QD-23 (0.60 g) | 2.4 g | Ethyl Lactate (15.0 g) |
| RE-10 | Ba-20 (2.7 g) | QD-15 (0.70 g) | — | Cyclohexanone (16.0 g) |

ECA-NMP* is a mixture solvent of ethylcellosolveacetate and N-methylprolidone (vol. ratio: 0.95:0.05)

TABLE 22

| Example | Resist | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|---|
| 1 | RE-1 | 90° C. 10 min. | 40 | 120° C. 5 min. | 1.59% 20 sec. | 0.35 |
| 2 | RE-1 | 100° C. 3 min. | 60 | 120° C. 3 min. | 1.19% 90 sec. | 0.35 |
| 3 | RE-2 | 90° C. 2 min. | 120 | 110° C. 2 min. | 2.38% 30 sec. | 0.40 |
| 4 | RE-3 | 90° C. 5 min. | 72 | 130° C. 1 min. | 1.59% 30 sec. | 0.40 |
| 5 | RE-4 | 100° C. 3 min. | 50 | 120° C. 3 min. | 1.19% 40 sec. | 0.30 |
| 6 | RE-5 | 100° C. 3 min. | 100 | 120° C. 3 min. | 1.19% 60 sec. | 0.35 |
| 7 | RE-6 | 100° C. 3 min. | 65 | 120° C. 3 min. | 1.19% 60 sec. | 0.35 |
| 8 | RE-7 | 90° C. 2 min. | 80 | 120° C. 5 min. | 1.19% 56 sec. | 0.35 |

TABLE 23

| Example | Resist | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|---|
| 9 | RE-8 | 100° C. 3 min. | 78 | 120° C. 3 min. | 1.19% 50 sec. | 0.35 |
| 10 | RE-9 | 90° C. 2 min. | 120 | 110° C. 2 min. | 1.59% 50 sec. | 0.40 |
| 11 | RE-10 | 80° C. 5 min. | 130 | 120° C. 5 min. | 2.38% 40 sec. | 0.40 |
| 12 | RE-1 | 110° C. 3 min. | 40 | 120° C. 3 min. | 1.19% 40 sec. | 0.30 |
| 13 | RE-2 | 100° C. 3 min. | 80 | 120° C. 3 min. | 2.38% 90 sec. | 0.35 |
| 14 | RE-4 | 110° C. 3 min. | 25 | 120° C. 3 min. | 1.19% 40 sec. | 0.30 |
| 15 | RE-8 | 110° C. 3 min. | 60 | 120° C. 3 min. | 1.19% 50 sec. | 0.35 |

TABLE 24

| | Composition of the Resist | | | |
|---|---|---|---|---|
| Resist | Acid-Decomposable Compound (Table 9) and Amount Thereof Used | Acid Generator and Amount Thereof | Alkali-Soluble Polymer and Amount Thereof | Solvent and Amount Thereof Used |
| RE-11 | Ba-20 (5.0 g) | C-1 (Table 16) (0.025 g) | — | Ethyl Cellosolve Acetate (15.8 g) |
| RE-12 | Ba-35 (4.5 g) | C-1 (Table 16) (0.25 g) | J-9 (Table 6) (1.5 g) | Ethyl Cellosolve Acetate (18.8 g) |
| RE-13 | Ba-25 (6.0 g) | C-2 (Table 16) (0.05 g) | — | Ethyl Lactate (18.0 g) |
| RE-14 | Ba-20 (6.0 g) | C-3 (Table 16) (0.30 g) | — | Ethyl Lactate (19.0 g) |
| RE-15 | Ba-25 (6.0 g) | C-3 (Table 16) (0.50 g) | J-4 (Table 6) (4.0 g) | Ethyl Lactate (31.5 g) |

TABLE 25

| | Composition of the Resist | | | |
|---|---|---|---|---|
| Resist | Acid-Decomposable Compound (Table 9) and Amount Thereof Used | Acid Generator and Amount Thereof | Alkali-Soluble Polymer and Amount Thereof | Solvent and Amount Thereof Used |
| RE-16 | Ba-35 (5.0 g) | C-3 (Table 16) (1.00 g) | J-13 (Table 7) (5.0 g) | Ethyl Cellosolve Acetate (45.0 g) |
| RE-17 | Ba-20 (8.0 g) | C-4 (Table 16) (0.50 g) | J-9 (Table 6) (2.0 g) | Ethyl Cellosolve Acetate (31.5 g) |
| RE-18 | Ba-20 (4.85 g) | C-5 (Table 16) (0.15 g) | — | Ethyl Cellosolve Acetate (15.0 g) |
| RE-19 | Ba-20 (4.75 g) | C-5 (Table 16) (0.25 g) | — | Ethyl Cellosolve Acetate (15.0 g) |

TABLE 26

| Example | Resist | Pre-Baking Conditions | Exposure Condition | Post-Exposure Baking Temp. & Time | TMAH Solution Concentration & Development Time | Exposure Amount (mJ/cm$^2$) | Resolution (μm) |
|---|---|---|---|---|---|---|---|
| 20 | RE-11 | 95° C. 90 sec. | KrF Excimer Laser (NA0.45) | 95° C. 90 sec. | 0.14N 90 sec. | 30 | 0.25 |
| 21 | RE-12 | 90° C. 120 sec. | KrF Excimer Laser (NA0.45) | 95° C. 90 sec. | 0.14N 60 sec. | 45 | 0.30 |
| 22 | RE-13 | 95° C. 90 sec. | KrF Excimer Laser (NA0.45) | 80° C. 120 sec. | 0.14N 50 sec. | 25 | 0.30 |
| 23 | RE-14 | 90° C. 300 sec. | i-line (NA0.50) | 105° C. 120 sec. | 0.14N 30 sec. | 50 | 0.35 |
| 24 | RE-15 | 95° C. 120 sec. | i-line (NA0.50) | 95° C. 90 sec. | 2.38% 30 sec. | 100 | 0.40 |

TABLE 27

| Example | Resist | Pre-Baking Conditions | Exposure Condition | Post-Exposure Baking Temp. & Time | TMAH Solution Concentration & Development Time | Exposure Amount (mJ/cm$^2$) | Resolution (μm) |
|---|---|---|---|---|---|---|---|
| 26 | RE-17 | 90° C. 180 sec. | KrF Excimer Laser (NA0.45) | 120° C. 120 sec. | 2.38% 30 sec. | 20 | 0.35 |
| 27 | RE-14 | 95° C. 90 sec. | KrF Excimer Laser (NA0.45) | 95° C. 90 sec. | 0.14N 50 sec. | 60 | 0.30 |
| 28 | RE-18 | 95° C. 90 sec. | KrF Excimer Laser (NA0.45) | 100° C. 120 sec. | 0.14N 30 sec. | 40 | 0.35 |
| 29 | RE-14 | 95° C. 90 sec. | KrF Excimer Laser (NA0.45) | 105° C. 90 sec. | 0.14N 50 sec. | 50 | 0.30 |
| 30 | RE-19 | 95° C. 90 sec. | KrF Excimer Laser (NA0.45) | 110° C. 120 sec. | 0.14N 50 sec. | 70 | 0.35 |

TABLE 28

| | Composition of the Resist | | | |
|---|---|---|---|---|
| Example | Acid Generator and Amount Thereof | O-quinonediazide (Tables 1 and 4) and Amount Thereof | Alkali-Soluble Polymer and Amount Thereof Used | Amount of Ethyl Cellosolve Acetate |
| 31 | B-1 (Table 11) (2.0 g) | QD-4 (1.0 g) | J-4 (Table 6) (8.0 g) | 37.0 g |
| 32 | B-2 (Table 11) (1.0 g) | QD-4 (0.44 g) | J-1 (Table 6) (3.0 g) | 14.0 g |
| 33 | B-3 (Table 11) (2.0 g) | QD-1 (0.44 g) | J-13 (Table 7) (3.0 g) | 18.0 g |
| 34 | B-4 (Table 11) (1.0 g) | QD-4 (0.44 g) | J-13 (Table 7) (3.0 g) | 14.0 g |

TABLE 29

| Example | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|
| 31 | 100° C. 3 min. | 80 | 120° C. 5 min. | 2.38% 40 sec. | 0.35 |
| 32 | 100° C. 3 min. | 70 | 120° C. 3 min. | 1.59% 30 sec. | 0.35 |
| 33 | 100° C. 3 min. | 60 | 120° C. 3 min. | 1.59% 60 sec. | 0.25 Initial Thickness; 0.50 μm |
| 34 | 100° C. 3 min. | 75 | 100° C. 5 min. | 2.38% 50 sec. | 0.25 Initial Thickness; 0.50 μm |

TABLE 30

| | Composition of the Resist | | | |
|---|---|---|---|---|
| Example | Acid Generator and Amount Therof | O-quinonediazide (Tables 1 and 3 to 5) and Amount Thereof | Alkali-Soluble Polymer and Amount Thereof Used | Solvent and Amount Thereof |
| 35 | B-5 (Table 12) (8.0 g) | OD-4 (0.5 g) QD-23 (0.5 g) | J-1 (Table 6) (2.0 g) | Ethyl Cellosolve Acetate (35 g) |
| 36 | B-6 (Table 12) (2.0 g) | QD-18 (1.0 g) | J-1 (Table 6) (7.0 g) | N-methyl-2-pyrrolidone (33 g) |
| 37 | B-7 (Table 12) (2.5 g) | QD-4 (1.0 g) | J-7 (Table 6) (6.5 g) | Ethyl Cellosolve Acetate (31 g) |
| 38 | B-8 (Table 13) (1.0 g) | QD-20 (0.8 g) | J-5 (Table 6) (6.0 g) | Ethyl Cellosolve Acetate (34 g) |
| 39 | B-9 (Table 13) (1.0 g) | QD-16 (1.0 g) | J-4 (Table 6) (6.0 g) | Ethyl Cellosolve Acetate (32 g) |

TABLE 31

| Example | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|
| 35 | 100° C. 3 min. | 110 | 120° C. 5 min. | 1.59% 40 sec. | 0.35 |
| 36 | 110° C. 3 min. | 150 | 150° C. 1 min. | 2.38% 40 sec. | 0.50 |
| 37 | 120° C. 3 min. | 100 | 130° C. 2 min. | 1.59% 50 sec. | 0.45 |
| 38 | 90° C. 5 min. | 80 | 125° C. 5 min. | 2.38% 50 sec. | 0.40 |
| 39 | 90° C. 10 min. | 130 | 125° C. 3 min. | 2.38% 50 sec. | 0.40 |

TABLE 32

| Example | Acid-Decomposable Compound and Amount Thereof | Acid Generator and Amount Thereof | Alkali-Soluble Polymer and Amount Thereof | Additive and Amount Thereof | Amount of ECA* (Solvent) |
|---|---|---|---|---|---|
| 40 | Ba-25 (Table 9) (8.3 g) | QD-4 (Table 1) (0.5 g) C-2 (Table 16) (0.2 g) | J-1 (Table 6) (7.5 g) | — | 35 g |
| 41 | Ba-20 (Table 9) (9.0 g) | QD-4 (Table 1) (1.0 g) C-9 (Table 17) (0.5 g) | — | — | 31 g |
| 42 | Ba-25 (Table 9) (8.0 g) | QD-4 (Table 1) (1.0 g) | J-5 (Table 6) (6.0 g) | W-1 (Table 19) (0.5 g) | 34 g |

ECA*: Eithyl Collosolve Acetate

TABLE 33

| Example | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|
| 40 | 85° C. 3 min. | 10 | 85° C. 3 min. | 1.59% 30 sec. | 0.35 |
| 41 | 100° C. 3 min. | 55 | 125° C. 2 min. | 1.59% 30 sec. | 0.35 |
| 42 | 90° C. 5 min. | 70 | 120° C. 3 min. | 1.19% 50 sec. | 0.35 |

TABLE 34

| Example | Acid-Decomposable Compound and Amount Thereof | Acid Generator and Amount Thereof | Alkali-Soluble Polymer and Amount Thereof | Additive and Amount Thereof | Amount of ECA* (Solvent) |
|---|---|---|---|---|---|
| 43 | B-12 (Table 14) (9.5 g) | QD-1 (Table 1) (0.5 g) C-9 (Table 17) (0.5 g) | — | W-3 (Table 19) (0.5 g) | 32 g |
| 44 | B-8 (Table 13) (5.5 g) | QD-4 (Table 1) (0.5 g) C-2 (Table 16) (0.2 g) | J-4 (Table 6) (4.5 g) | W-2 (Table 19) (0.8 g) | 35 g |
| 45 | B-10 (Table 14) (2.0 g) | C-10 (Table 17) (1.0 g) | J-5 (Table 6) (7.0 g) | — | 35 g |
| 46 | B-11 (Table 14) (3.0 g) | Q-17 (Table 4) (1.0 g) | J-1 (Table 6) (7.0 g) | — | 34 g |

ECA*: Eithyl Collosolve Acetate

TABLE 35

| Example | Pre-Baking Temp., Time | Exposure Amount (mJ/cm$^2$) | Post-Exposure Baking Temp. & Time | TMAH Solution Concentration & Development Time | Resolution (μm) |
|---|---|---|---|---|---|
| 43 | 80° C. 5 min. | 50 | 90° C. 2 min. | 1.59% 30 sec. | 0.40 |
| 44 | 80° C. 5 min. | 15 | 90° C. 2 min. | 2.38% 40 sec. | 0.40 |
| 45 | 100° C. 3 min. | 120 | 110° C. 5 min. | 1.59% 40 sec. | 0.45 |
| 46 | 90° C. 5 min. | 60 | 120° C. 3 min. | 1.19% 50 sec. | 0.45 |

TABLE 36

| Example | Acid-Decomposable Compound and Amount Thereof | Acid Generator and Amount Thereof | Alkali-Soluble Polymer and Amount Thereof | Carboxylic Acid and Amount Thereof | Amount of ECA[1*] (Solvent) |
|---|---|---|---|---|---|
| 55 | Ba-35 (Table 9) (3.0 g) | C-7 (Table 16) (0.2 g) | J-1 (Table 6) (1.0 g) | 4-methyl benzoic acid (0.2 g) | 13 g |
| 56 | Ba-35 (Table 9) (3.0 g) | QD-4 (Table 1) (0.44 g) | J-4 (Table 6) (2.0 g) | 4-tert butyl benzoic acid (0.2 g) | 14 g |
| 57 | Ba-35 (Table 9) (3.0 g) | C-8 (Table 16) (0.1 g) | J-1 (Table 6) (1.0 g) | 4-tert butyl phenylacetic acid (0.1 g) | 12.6 g |
| 58 | Ba-25 (Table 9) (4.0 g) | QD-4[2*] (Table 1) (0.21 g) | — | ascorbic acid (0.1 g) | 12.6 g |

ECA[1*]: Ethyl Cellosolve Acetate
QD-4[2*]: Compound having esterification number of 3 per molecule

TABLE 37

| Example | Pre-Baking Temp., Time | Post-Exposure Baking Temp. & Time | TMAH Solution Concentration & Development Time | Sensitivity Exposure Amount (mJ/cm$^2$) | Resolution (μm) |
|---|---|---|---|---|---|
| 55 | 80° C. 5 min. | 90° C. 3 min. | 2.38% 30 sec. | 35 | 0.35 |
| 56 | 90° C. 5 min. | 120° C. 2 min. | 2.38% 30 sec. | 52 | 0.30 |
| 57 | 100° C. 2 min. | 110° C. 2 min. | 2.38% 30 sec. | 80 | 0.35 |
| 58 | 90° C. 3 min. | 105° C. 2 min. | 2.38% 30 sec. | 70* | 0.40 |

Note: The sensitivity of Example 58, specified in the table, is the value measured in the case color an i-line stepper (NA: 0.50) was used as light source.

TABLE 38

| | Composition of the Resist | | | | |
|---|---|---|---|---|---|
| Example | Acid-Decomposable Compound and Amount Thereof | Acid Generator and Amount Thereof | Alkali-Soluble Polymer and Amount Thereof | Carboxylic Acid and Amount Thereof | Solvent and Amount Thereof |
| 59 | Ba-30 (Table 9) (4.0 g) | C-1 (Table 16) (0.2 g) | — | 2,2-dimethyl-3-hydroxypropanic acid (0.1 g) | Ethyl lactate (12.6 g) |
| 60 | Bb-25 (Table 10) (4.0 g) | C-1 (Table 16) (0.44 g) | — | 4-phenoxyacetic acid (0.1 g) | Ethyl lactate (12.6 g) |
| 61 | B-13 (Table 15) (4.0 g) | C-4 (Table 16) (0.1 g) | — | 3,4-dimethyl benzoic acid (0.1 g) | ECA* (13.0 g) |
| 62 | B-14 (Table 15) (3.0 g) | C-1 (Table 16) (0.1 g) | J-18 (Table 8) (1.0 g) | α-phenyl propionic acid (0.1 g) | ECA* (13.0 g) |

ECA*: Ethyl Cellosolve Acetate

TABLE 39

| Example | Pre-Baking Temp., Time | Post-Exposure Baking Temp. & Time | TMAH Solution Concentration & Development Time | Sensitivity Exposure Amount (mJ/cm$^2$) | Resolution (μm) |
|---|---|---|---|---|---|
| 59 | 80° C. 5 min. | 95° C. 3 min. | 2.38% 30 sec. | 25 | 0.40 |
| 60 | 80° C. 5 min. | 95° C. 3 min. | 2.38% 30 sec. | 20 | 0.40 |
| 61 | 90° C. 3 min. | 110° C. 2 min. | 2.38% 30 sec. | 90 | 0.40 |
| 62 | 80° C. 3 min. | 100° C. 2 min. | 2.38% 30 sec. | 25 | 0.40 |

TABLE 40

| | Composition of the Resist | | | | |
|---|---|---|---|---|---|
| Resist | Acid-Decomposable Compound (Table 9) and Amount Thereof Used | Storong-Acid Generator and Amount Thereof | Weak-Acid Generator and Amount Thereof | Alkali-Soluble Polymer and Amount Thereof | Solvent and Amount Thereof Used |
| RE-21 | Ba-20 (5.0 g) | C-1 (Table 16) (0.025 g) | D-2 (Table 18) (0.56 g) | — | Ethyl lactate (16.7 g) |
| RE-22 | Ba-20 (5.0 g) | C-2 (Table 16) (0.05 g) | D-3 (Table 18) (0.20 g) | — | Ethyl lactate (16.7 g) |
| RE-23 | Ba-20 (5.0 g) | C-3 (Table 16) (0.29 g) | D-1 (Table 18) (0.59 g) | — | ECA$^{1*}$ (17.6 g) |
| RE-24 | Ba-25) (4.0 g) | C-4 (Table 16) (0.05 g) | D-4 (Table 18) (0.50 g) | J-9 (Table 6) (1.5 g) | CHN$^{2*}$ (16.7 g) |
| RE-25 | Ba-30 (10.0 g) | C-5 (Table 16) (0.3 g) | D-5 (Table 18) (1.00 g) | — | Ethyl lactate (16.7 g) |

ECA$^{1*}$: Eithyl Collosolve Acetate
CHN$^{2*}$: Cyclohexanone

TABLE 41

| | Composition of the Resist | | | | |
|---|---|---|---|---|---|
| Resist | Acid-Decomposable Compound (Table 9) and Amount Thereof Used | Storong-Acid Generator and Amount Thereof | Weak-Acid Generator and Amount Thereof | Alkali-Soluble Polymer and Amount Thereof | Solvent and Amount Thereof Used |
| RE-26 | Ba-20 (10.0 g) | C-1 (Table 16) (0.1 g) | D-1 (Table 18) (0.30 g) | — | ECA* (31.2 g) |
| RE-27 | Ba-25 (10.0 g) | C-1 (Table 16) (0.05 g) | D-6 (Table 18) (0.50 g) | — | ECA* (31.6 g) |
| RE-28 | Ba-25 (6.0 g) | C-3 (Table 16) (0.5 g) | D-1 (Table 18) (1.00 g) | J-4 (Table 6) (4.0 g) | Ethyl lactate (34.5 g) |
| RE-29 | Ba-30 (10.0 g) | C-6 (Table 16) (0.25 g) | D-4 (Table 18) (1.00 g) | — | ECA* (16.7 g) |
| RE-30 | Ba-20 (6.0 g) | C-3 (Table 16) (0.25 g) | D-1 (Table 18) (0.30 g) | J-13 (Table 7) (3.0 g) | ECA* (6.6 g) |

ECA*: Eithyl Collosolve Acetate

TABLE 42

| Example | Resist | Pre-Baking Conditions | Exposure Condition | Post-Exposure Baking Temp. & Time | TMAH Solution Concentration & Development Time | Sensitivity Exposure Amount (mJ/cm$^2$) | Resolution (μm) |
|---|---|---|---|---|---|---|---|
| 63 | RE-21 | 95° C. 90 sec. | KrF excimer laser (NA0.45) | 95° C. 90 sec. | 1.19% 90 sec. | 65 | 0.35 |
| 64 | RE-22 | 80° C. | KrF excimer | 85° C. | 1.19% | 30 | 0.30 |

TABLE 42-continued

| Example | Resist | Pre-Baking Conditions | Exposure Condition | Post-Exposure Baking Temp. & Time | TMAH Solution Concentration & Development Time | Sensitivity Exposure Amount (mJ/cm$^2$) | Resolution (μm) |
|---|---|---|---|---|---|---|---|
| 65 | RE-23 | 90° C. 90 sec. | laser (NA0.45) i-line (NA0.50) | 60 sec. 110° C. | 60 sec. 2.38% | 50 | 0.40 |
| 66 | RE-24 | 90° C. 180 sec. | KrF excimer laser (NA0.45) | 120 sec. 100° C. 120 sec. | 50 sec. 2.38% 50 sec. | 75 | 0.35 |
| 67 | RE-25 | 95° C. 90 sec. | KrF excimer laser (NA0.45) | 95° C. 90 sec. | 2.38% 50 sec. | 60 | 0.40 |

TABLE 43

| Example | Resist | Pre-Baking Conditions | Exposure Condition | Post-Exposure Baking Temp. & Time | TMAH Solution Concentration & Development Time | Sensitivity Exposure Amount (mJ/cm$^2$) | Resolution (μm) |
|---|---|---|---|---|---|---|---|
| 68 | RE-26 | 95° C. 90 sec. | KrF excimer laser (NA0.45) | 95° C. 90 sec. | 2.38% 30 sec. | 65 | 0.40 |
| 69 | RE-27 | 95° C. 90 sec. | KrF excimer laser (NA0.45) | 95° C. 50 sec. | 1.19% 50 sec. | 50 | 0.35 |
| 70 | RE-28 | 90° C. 180 sec. | i-line (NA0.50) | 105° C. 120 sec. | 2.38% 30 sec. | 80 | 0.35 |
| 71 | RE-29 | 90° C. 180 sec. | KrF excimer laser (NA0.45) | 105° C. 120 sec. | 2.38% 30 sec. | 70 | 0.35 |

What is claimed is:

1. A resist pattern forming method comprising:

forming a resist film on a substrate, pattern-exposing the resist film, and developing the resist film thus pattern-exposed, wherein the resist comprises:

(a) an acid-generating compound which generates an acid when exposed to ultraviolet rays or ionizing radiation; and (b) a compound which has an acid decomposable substituent group and which is represented by the following formula (I)

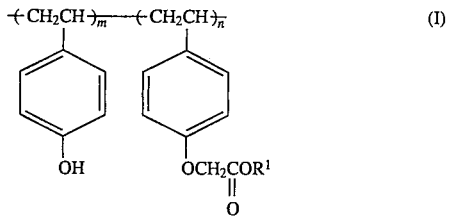

(I)

where $R^1$ is a monovalent organic group, and m and n satisfy the following formula: $n/(m+n)=0.17$ to $0.60$.

2. The resist pattern forming method according to claim 1, wherein $R^1$ in the formula (I) is tert-butyl.

3. The resist pattern forming method according to claim 1, wherein said acid-generating compound is triphenylsulfonium trifluoromethanesulfonate.

4. The resist pattern forming method according to claim 1, wherein said acid-generating compound is an 0-quinonediazide compound.

5. The resist pattern forming method according to claim 4, wherein said 0-quinonediazide compound is 1-naphthoquinone-2-diazo-4-ester sulfonate.

6. The resist pattern forming method according to claim 1, wherein the acid generating compound is used in an amount of 0.1 to 30 wt %, based on the total weight of the solid components of the resist.

7. The resist pattern forming method according to claim 1, wherein said resist further comprises an alkali soluble polymer.

8. The resist pattern forming method according to claim 7, wherein said alkali soluble polymer is used in an amount of 90 parts by weight or less, wherein the total amount of said acid decomposable compound and said alkali soluble polymer is 100 parts by weight.

9. A resist pattern forming method comprising:

forming a resist film on a substrate, forming a layer of an acidic water-soluble polymer on the resist film, pattern-exposing the resist film with the polymer layer, and developing the pattern exposed resist film with the polymer layer, wherein the resist comprises:

(a) an acid generating compound which generates an acid when exposed to ultraviolet rays or ionizing radiation; and (b) a compound which has an acid decomposable substituent group and which is represented by the following formula (I)

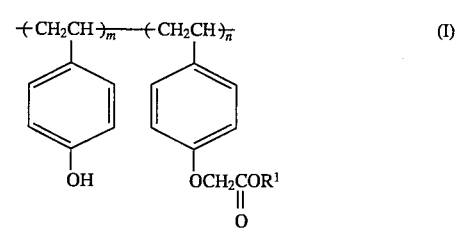

(I)

where $R^1$ is a monovalent organic group, m is 0, 1 or a positive number greater than 1, and n is a positive number.

10. The resist pattern forming method according to claim 9, wherein $R^1$ in the formula (I) is tert-butyl.

11. The resist pattern forming method according to claim 9, wherein the acid water-soluble polymer has a carboxy group or a sulfo group as a substituent group.

12. The resist pattern forming method according to claim 9, wherein the acidic water-soluble polymer is at least one polymer selected from the group consisting of polyacrylic acid, polymethacrylic acid, polystyrenesulfonic acid, polymalic acid, polyitaconic acid, ethylene-anhydrous maleic acid copolymer, ethylene-methacrylic acid copolymer, ethylvinylether-anhydrous maleic acid copolymer and styrene-anhydrous maleic acid copolymer.

13. The resist pattern forming method according to claim 9, wherein said acid-generating compound is triphenylsulfonium trifluoromethanesulfonate.

14. The resist pattern forming method according to claim 9, wherein said acid-generating compound is an o-quinonediazide compound.

15. The resist pattern forming method according to claim 14, wherein said o-quinonediazide compound is 1-naphthoquinone-2-diazo-4-ester sulfonate.

16. The resist pattern forming method according to claim 9, wherein the acid generating compound is used in an amount of 0.1 to 30 wt %, based on the total weight of the solid components of the resist.

17. The resist pattern forming method according to claim 9, wherein said resist further comprises an alkali soluble polymer.

18. The resist pattern forming method according to claim 17, wherein said alkali soluble polymer is used in an amount of 90 parts by weight or less, where the total amount of said acid decomposable compound and said alkali soluble polymer is 100 parts by weight.

* * * * *

UNITED STATES PATENT AND TRADEMARK OFFICE
CERTIFICATE OF CORRECTION

PATENT NO. : 5,580,702
DATED : December 3, 1996
INVENTOR(S) : Rumiko HAYASE, et al.

It is certified that error appears in the above-indentified patent and that said Letters Patent is hereby corrected as shown below:

On the title page, in Item [75], the last inventor's last name should read:

-- [75] Hayase. --

Signed and Sealed this

First Day of April, 1997

BRUCE LEHMAN

Attest:

Attesting Officer

Commissioner of Patents and Trademarks